US012635463B2

(12) United States Patent
Saito et al.

(10) Patent No.: US 12,635,463 B2
(45) Date of Patent: May 19, 2026

(54) SUBSTRATE TRANSFERRING DEVICE

(71) Applicant: KAWASAKI JUKOGYO KABUSHIKI KAISHA, Kobe (JP)

(72) Inventors: Masayuki Saito, Akashi (JP); Takayuki Fukushima, Takarazuka (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 18/213,339

(22) Filed: Jun. 23, 2023

(65) Prior Publication Data

US 2023/0352331 A1     Nov. 2, 2023

Related U.S. Application Data

(63) Continuation of application No. 17/311,630, filed as application No. PCT/JP2019/047417 on Dec. 4, 2019, now abandoned.

(30) Foreign Application Priority Data

Dec. 7, 2018     (JP) ................................. 2018-229711
May 24, 2019     (JP) ................................. 2019-097731

(51) Int. Cl.
*H01L 21/677* (2006.01)
*B25J 11/00* (2006.01)
(Continued)

(52) U.S. Cl.
CPC ..... *H01L 21/67778* (2013.01); *B25J 11/0095* (2013.01); *B25J 13/089* (2013.01); *H01L 21/67259* (2013.01); *H01L 21/68707* (2013.01)

(58) Field of Classification Search
CPC ......... H01L 21/67778; H01L 21/67259; H01L 21/68707
See application file for complete search history.

(56) References Cited

U.S. PATENT DOCUMENTS 5,645,391 A     7/1997 Ohsawa et al.
6,206,441 B1     3/2001 Wen et al.
(Continued)

FOREIGN PATENT DOCUMENTS

JP     H05-343499 A     12/1993
JP     07335718 A   *  12/1995
(Continued)

*Primary Examiner* — Gerald McClain
(74) *Attorney, Agent, or Firm* — Oliff PLC

(57) ABSTRACT

A method for operating a substrate transferring device that includes a substrate container holding at least two substrates stacked vertically, a hand having two fingers, a manipulator, and a controller. A mapping device detects a vertical position of a higher substrate, and a substrate detector measures a distance to a principal surface of the substrate. The controller moves the hand to a position below the detected vertical position and then advances the hand to pick up the higher substrate. During forward movement, the substrate detector acquires at least three consecutive, linearly aligned distance measurements along a front-and-rear direction. Based on a relationship among the measurements, the controller determines whether the principal surface of the higher substrate is warped. If warpage is detected, the controller predicts a possibility of collision between the hand and the substrate and withdraws the hand to avoid collision.

7 Claims, 18 Drawing Sheets

(51) Int. Cl.
    *B25J 13/08*       (2006.01)
    *H01L 21/67*      (2006.01)
    *H01L 21/687*     (2006.01)

(56)              References Cited

U.S. PATENT DOCUMENTS

| | | | |
|---|---|---|---|
| 6,813,543 B2 * | 11/2004 | Aalund | H01L 21/67265 |
| | | | 700/250 |
| 7,387,484 B2 * | 6/2008 | Ho | H01L 21/67748 |
| | | | 414/217 |
| 9,390,958 B2 | 7/2016 | Onishi et al. | |
| 9,691,651 B2 * | 6/2017 | Coady | H01L 21/68707 |
| 11,538,700 B2 * | 12/2022 | Ayabe | B65G 47/90 |
| 2004/0068347 A1 * | 4/2004 | Aalund | H01L 21/68707 |
| | | | 318/568.11 |
| 2012/0290124 A1 * | 11/2012 | Kimura | H01L 21/67265 |
| | | | 700/218 |
| 2016/0133502 A1 | 5/2016 | Won et al. | |
| 2019/0371638 A1 * | 12/2019 | Wu | H01L 21/67383 |
| 2020/0365436 A1 | 11/2020 | Houng et al. | |
| 2021/0090918 A1 * | 3/2021 | Kuwahara | H01L 21/67778 |
| 2022/0301912 A1 * | 9/2022 | Kuwahara | H01L 21/68707 |

FOREIGN PATENT DOCUMENTS

| | | |
|---|---|---|
| JP | H07-335718 A | 12/1995 |
| JP | 2002270674 A | 9/2002 |
| JP | 2005-136280 A | 5/2005 |
| JP | 2010-278044 A | 12/2010 |
| JP | 2012-015530 A | 1/2012 |
| JP | 2012-235058 A | 11/2012 |
| JP | 2017-011178 A | 1/2017 |
| TW | 200418701 A | 10/2004 |

\* cited by examiner (A)

(B)

(C)

(A)

(B)

(C)

(A)

(B)

(C)

211

(A)

(B)

SUBSTRATE TRANSFERRING DEVICE

CROSS-REFERENCE TO RELATED APPLICATION(S)

This application is a continuation of U.S. application Ser. No. 17/311,630 filed Jun. 7, 2021, which is a national stage application of International Patent Application No. PCT/JP2019/047417 filed on Dec. 4, 2019, and is based on and claims priority under 35 U.S.C. 119 from Japanese Patent Application No. 2018-229711 filed on Dec. 7, 2018, Japanese Patent Application No. 2019-097731 filed on May 24, 2019. The contents of the above applications are incorporated herein by reference.

TECHNICAL FIELD

The present disclosure relates to a substrate transferring device and a method of operating the same.

BACKGROUND ART

Semiconductor wafers are manufactured through a plurality of processings inside a clean room. In the manufacturing of the semiconductor wafers, they are transferred while being accommodated in a carrier (a pod).

Meanwhile, substrate processing devices which detect a positional deviation of the wafer inside the pod are known. Patent Document 1 discloses one example of such substrate processing devices.

A substrate processing device disclosed in Patent Document 1 is provided with a mapping device and a wafer-positional-deviation detecting device. The mapping device and the wafer-positional-deviation detecting device are provided at a wafer loading/unloading port of a pod opener which opens and closes a door of the pod.

The mapping device is provided with a plurality of pairs of a light-emitting part and a light-receiving part opposing to each other. The plurality of pairs of the light-emitting part and the light-receiving part are vertically aligned in a comb-teeth like shape. Then, when light emitted from the light-emitting part is detected by the light-receiving part, it is determined that the wafer is not placed.

The wafer-positional-deviation detecting device is provided with a plurality of limited-reflective sensors. Each limited-reflective sensor has a light-emitting part and a light-receiving part. The limited-reflective sensor has a detectable range only within a given distance and a given range from the light-emitting part and the light-receiving part to an outer circumferential surface of the wafer which is a target object of the detection. The limited-reflective sensor receives reflected light, which is emitted from the light-emitting part and reflected at the outer circumferential surface of the wafer, by the light-receiving part within this detectable range.

REFERENCE DOCUMENT OF CONVENTIONAL ART

Patent Document

[Patent Document 1] JP2012-015530A

DESCRIPTION OF THE DISCLOSURE

Problem to be Solved by the Disclosure

In the substrate processing device disclosed in Patent Document 1, both of the mapping device and a waferpositional-deviation device are provided near the wafer loading/unloading port. Therefore, the positional deviation of the wafer may be difficult to be detected at a holding groove of the pod on a farther side from the wafer loading/unloading port (at a holding groove at an inner side in the pod).

When the wafer increases in the size and a gap between the plurality of wafers is smaller, an inclining angle of the wafer is small even when the wafer is not placed on the farther-side holding groove of the pod. For example, when a diameter of the wafer is 30 cm or above, and the gap between the plurality of wafers is 5 to 20 mm, the inclining angle of the wafer is small. The positional deviation of the wafer by such a little inclining angle may be difficult to be detected by the mapping device and the wafer-positional-deviation device provided near the wafer loading/unloading port. Therefore, the mapping device and the wafer-positional-deviation device still have room for improvement.

One purpose of the present disclosure is to provide a substrate transferring device and a method of operating the substrate transferring device, capable of accurately detecting a positional deviation of a substrate.

SUMMARY OF THE DISCLOSURE

A substrate transferring device according to the present disclosure transfers a substrate from a placing stand on which the substrate is placed, while holding the substrate. The substrate transferring device includes a hand configured to hold the substrate, a manipulator to which the hand is attached, and a first substrate detector provided to the hand and configured to detect a distance to a principal surface of the substrate placed on the placing stand.

Preferably, the first substrate detector is a capacitive sensor.

Preferably, the first substrate detector is provided to a tip-end part of the hand.

Preferably, the substrate transferring device further includes a second substrate detector provided to the hand at a position different from the first substrate detector in a front-and-rear direction, and configured to detect a distance to the principal surface of the substrate.

In order to solve the conventional problem, another substrate transferring device according to the present disclosure transfers a substrate from a container in which a plurality of substrates are accommodated, while holding the substrate. The substrate transferring device includes a hand configured to hold the substrate, a manipulator, and a controlling device. The hand is provided at a tip-end part with a substrate detector having a first light-emitting part configured to emit light toward a principal surface of the substrate, and a first light-receiving part configured to receive the light reflected on the principal surface of the substrate. The controlling device causes the first light-emitting part of the substrate detector to emit the light toward the principal surface of the substrate while the controlling device operates the manipulator to enter the hand into the container, and determines an occurrence of a positional deviation of the substrate based on whether the first light-receiving part of the substrate detector receives the light reflected on the principal surface of the substrate.

Thus, even when the position of the substrate deviates on the farther side in the container in which the substrates are accommodated, the positional deviation can be detected.

A method of operating a substrate transferring device according to the present disclosure is provided, the substrate transferring device including a hand configured to hold a substrate, a manipulator to which the hand is attached, and a first substrate detector provided to the hand and configured to detect a distance to a principal surface of the substrate. The operating method includes the steps of (A) preparing the substrate placed on a placing stand, (B) detecting the distance to the principal surface of the substrate placed on the placing stand, and (C) holding the substrate by the hand.

Preferably, the (B) in the operating method includes detecting the distance to the principal surface of the substrate at three or more locations. The operating method further includes (D) determining whether to hold the substrate by the hand based on the distance to the principal surface of the substrate detected at the three or more locations.

Preferably, the (B) in the operating method includes detecting the distance to the principal surface of the substrate at three or more locations. The operating method further includes (E) determining a position at which the substrate is held based on the distance to the principal surface of the substrate detected at the three or more locations.

Preferably, the (B) in the operating method includes changing a moving path of the hand when the distance detected by the first substrate detector is below a given lower limit, so that the distance to the principal surface of the substrate becomes larger than the given lower limit.

Preferably, in the operating method, the first substrate detector is a capacitive sensor. The (B) in the operating method includes determining whether a capacitance of the substrate is within a given range.

Moreover, another method of operating a substrate transferring device according to the present disclosure is to transfer a substrate from a container in which a plurality of substrates are accommodated, while holding the substrate. The substrate transferring device includes a hand configured to hold the substrate, a manipulator, and a controlling device. The method includes the steps of providing, at a tip-end part of the hand, a substrate detector having a first light-emitting part configured to emit light toward a principal surface of the substrate, and a first light-receiving part configured to receive the light reflected on the principal surface of the substrate, and configuring the controlling device to cause the first light-emitting part of the substrate detector to emit the light toward the principal surface of the substrate while the manipulator being operated to enter the hand into the container, and determine an occurrence of a positional deviation of the substrate based on whether the first light-receiving part of the substrate detector receives the light reflected on the principal surface of the substrate.

Thus, even when the position of the substrate deviates on the farther side in the container in which the substrates are accommodated, the positional deviation can be detected.

The above purpose, other purposes, features, and advantages of the present disclosure will be made clear from the following detailed description of suitable embodiments with reference to the accompanying drawings.

Effect of the Disclosure

According to the substrate transferring device and the method of operating the same of the present disclosure, the positional deviation of the substrate can be detected more accurately than the conventional substrate processing device.

MODES FOR CARRYING OUT THE DISCLOSURE

Figure 1:
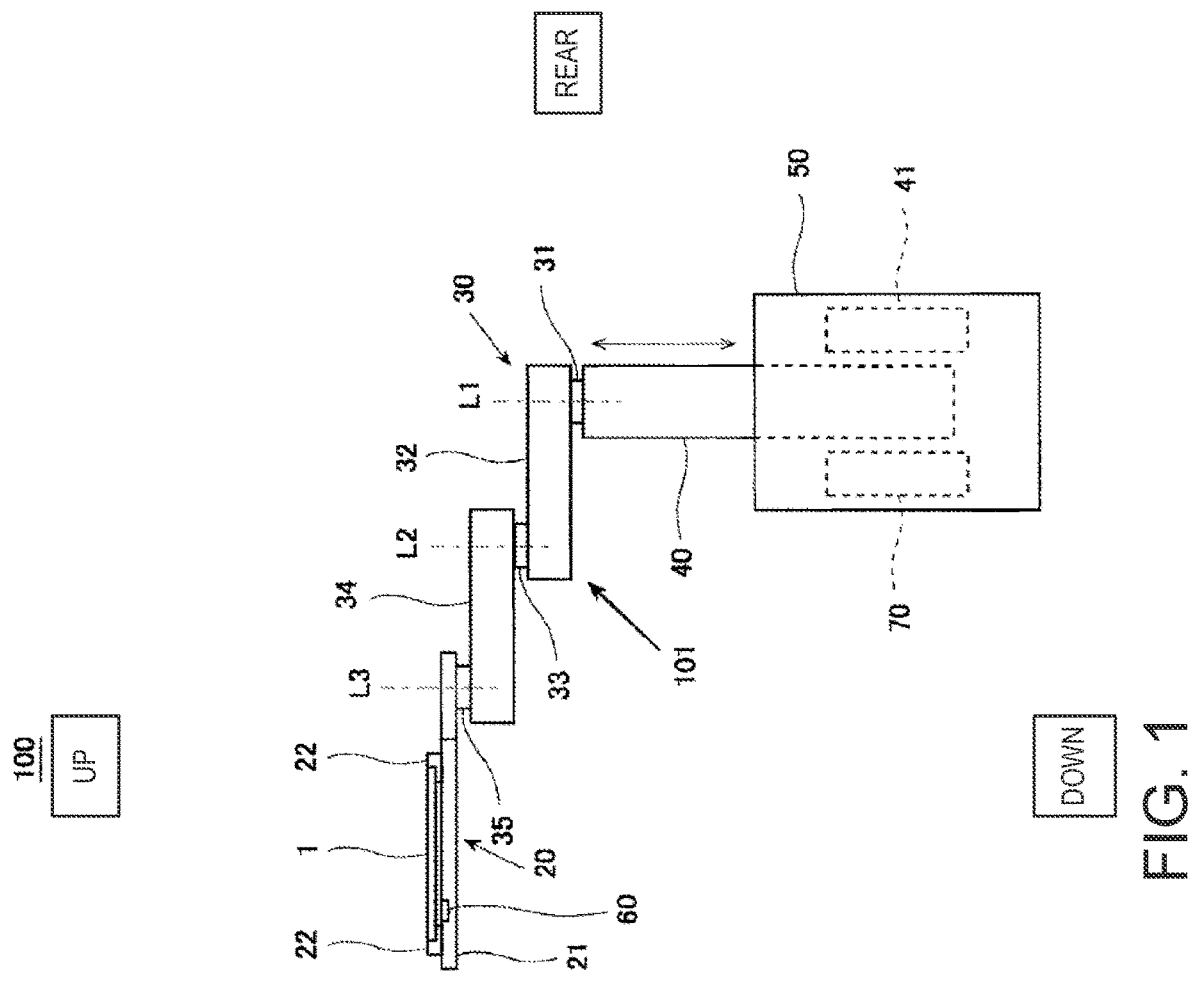
FIG. 1 is a side view schematically illustrating an outline configuration of a substrate transferring device and a robot system having the substrate transferring device according to Embodiment 1.
Figure 1:
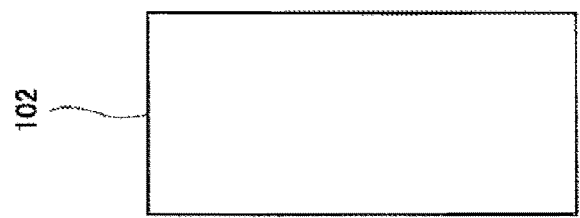

Hereinafter, preferred embodiments of the present disclosure are described with reference to the accompanying drawings. Note that the same reference characters are given to a similar configuration throughout the drawings to omit redundant description. Moreover, throughout the drawings, a configuration necessary to illustrate the present disclosure is extracted, and the other configuration may be omitted to be illustrated. Furthermore, this configuration is an example of the embodiments of the present disclosure, and the present disclosure is not limited to this.

A substrate transferring device according to Embodiment 1 is a substrate transferring device which transfers a substrate from a container in which a plurality of substrates are accommodated, while holding the substrate. The substrate transferring device includes a hand which holds the substrate, a manipulator, and a controlling device. The hand is provided at its tip-end part with a substrate detector having a first light-emitting part which emits light toward a principal surface of the substrate, and a first light-receiving part which receives the light reflected on the principal surface of the substrate. The controlling device causes the first light-emitting part of the substrate detector to emit the light toward the principal surface of the substrate while the controlling device operates the manipulator to enter the hand into the container, and determines an occurrence of a positional deviation of the substrate based on whether the first light-receiving part of the substrate detector receives the light reflected on the principal surface of the substrate.

Moreover, in the substrate transferring device according to Embodiment 1, the substrate detector may receive the light reflected on the principal surface of the substrate by the first light-receiving part, when the first light-emitting part emits the light toward the principal surface of the substrate while the substrate is accommodated correctly. The controlling device may cause the first light-emitting part of the substrate detector to emit the light toward the principal surface of the substrate while the controlling device operates the manipulator to enter the hand into the container. The controlling device may determine that the positional deviation of the substrate occurs when the first light-receiving part of the substrate detector does not receive the light reflected on the principal surface of the substrate.

Moreover, in the substrate transferring device according to Embodiment 1, the substrate detector may receive the light reflected on the principal surface of the substrate by the first light-receiving part, when the first light-emitting part emits the light toward the principal surface of the substrate while the substrate is accommodated correctly. The controlling device may cause the first light-emitting part of the substrate detector to emit the light toward the principal surface of the substrate while the controlling device operates the manipulator to enter the hand into the container. The controlling device may determine that the positional deviation of the substrate does not occur when the first light-receiving part of the substrate detector receives the light reflected on the principal surface of the substrate.

Moreover, in the substrate transferring device according to Embodiment 1, the substrate detector may not receive the light reflected on the principal surface of the substrate by the first light-receiving part, when the first light-emitting part emits the light toward the principal surface of the substrate while the substrate is accommodated correctly. The controlling device may cause the first light-emitting part of the substrate detector to emit the light toward the principal surface of the substrate while the controlling device operates the manipulator to enter the hand into the container. The controlling device may determine that the positional deviation of the substrate occurs when the first light-receiving part of the substrate detector receives the light reflected on the principal surface of the substrate.

Moreover, in the substrate transferring device according to Embodiment 1, the substrate detector may receive the light reflected on the principal surface of the substrate by the first light-receiving part, when the first light-emitting part emits the light toward the principal surface of the substrate while the substrate is accommodated correctly. The substrate transferring device may cause the first light-emitting part of the substrate detector to emit the light toward the principal surface of the substrate while the controlling device operates the manipulator to enter the hand into the container. The substrate transferring device may determine that the positional deviation of the substrate does not occur when the first light-receiving part of the substrate detector does not receive the light reflected on the principal surface of the substrate.

Moreover, in the substrate transferring device according to Embodiment 1, the substrate detector may receive the light reflected on the principal surface of the substrate by the first light-receiving part, when the principal surface of the substrate is located at a second distance smaller than the first distance. The controlling device may cause the first light-emitting part of the substrate detector to emit the light toward the principal surface of the substrate while the controlling device operates the manipulator to enter the hand into the container. The controlling device may determine that the positional deviation of the substrate occurs when the first light-receiving part of the substrate detector receives the light reflected on the principal surface of the substrate.

Moreover, in the substrate transferring device according to Embodiment 1, the substrate detector may receive the light reflected on the principal surface of the substrate by the first light-receiving part, when the principal surface of the substrate is located at a second distance smaller than the first distance. The controlling device may cause the first light-emitting part of the substrate detector to emit the light toward the principal surface of the substrate while the controlling device operates the manipulator to enter the hand into the container. The controlling device may determine that the positional deviation of the substrate does not occur when the first light-receiving part of the substrate detector does not receive the light reflected on the principal surface of the substrate.

Moreover, in the substrate transferring device according to Embodiment 1, the substrate detector may upwardly emit the light by the first light-emitting part.

Moreover, in the substrate transferring device according to Embodiment 1, the controlling device may suspend the operation of the manipulator when the controlling device determines that the positional deviation of the substrate occurs.

Moreover, in the substrate transferring device according to Embodiment 1, the controlling device may operate the manipulator to cause the hand to evacuate from the container when the controlling device determines that the positional deviation of the substrate occurs.

Below, one example of the substrate transferring device according to Embodiment 1 is described with reference to FIGS. 1-?.

[Configuration of Substrate Transferring Device]

Figure 2:
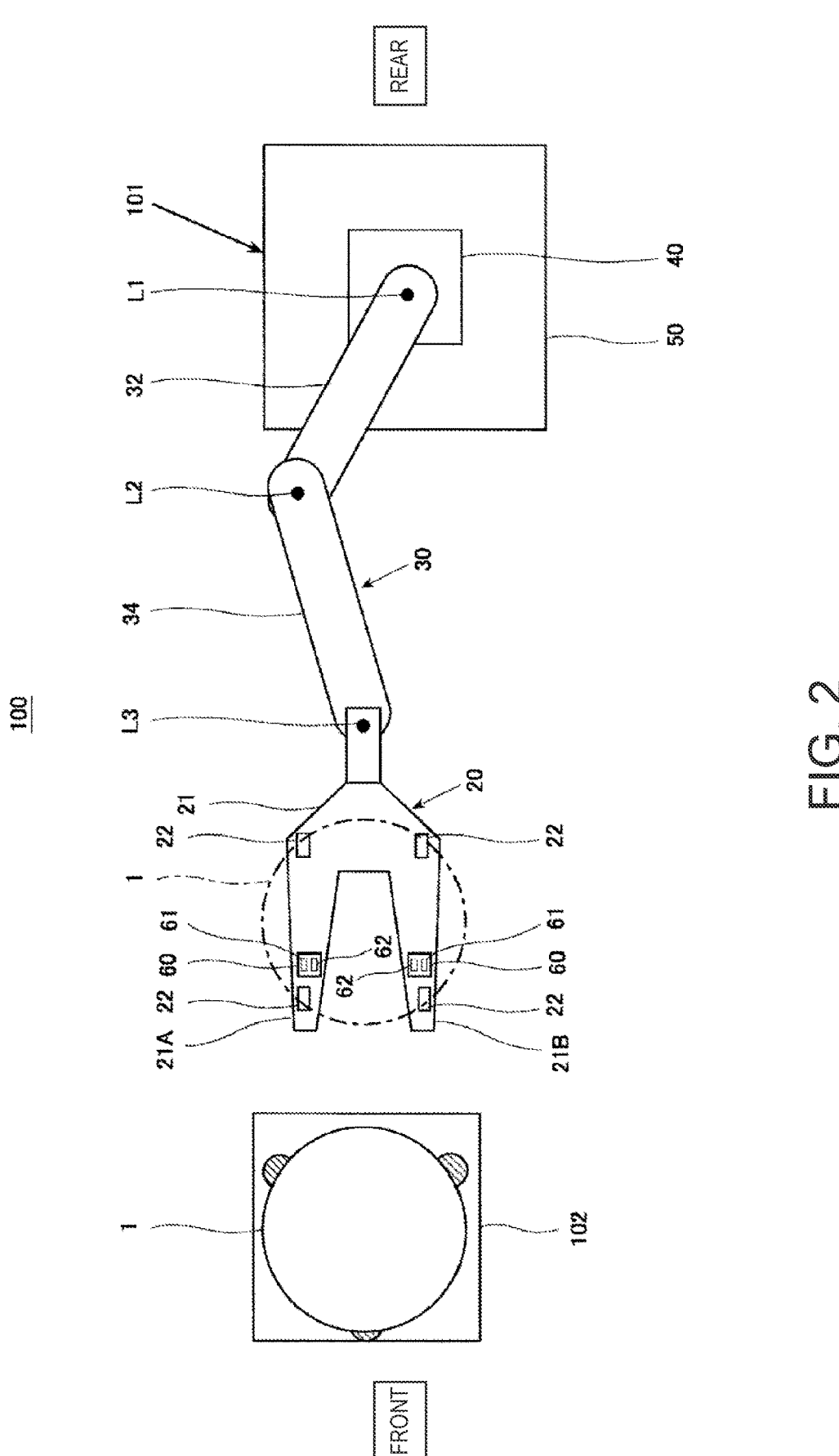
FIG. 2 is a top view schematically illustrating the outline configuration of the robot system illustrated in FIG. 1.

FIG. 1 is a side view schematically illustrating an outline configuration of a substrate transferring device and a robot system having it according to Embodiment 1. FIG. 2 is a top view schematically illustrating the outline configuration of the robot system illustrated in FIG. 1.

Note that, in FIG. 1, a front-and-rear direction and an up-and-down direction of the substrate transferring device are indicated as a front-and-rear direction and an up-and-down direction of the drawing. Moreover, in FIG. 2, the front-and-rear direction of the substrate transferring device is indicated as a front-and-rear direction of the drawing.

As illustrated in FIGS. 1 and 2, a robot system 100 according to Embodiment 1 is provided with a substrate transferring device 101, and a container 102 in which substrates 1 are accommodated. The container 102 is, for example, a FOUP (Front Opening Unified Pod), or a quartz boat.

Moreover, the substrate 1 is, for example, a circular thin plate which is material for a substrate for a semiconductor device, such as a semiconductor substrate and a glass substrate. The semiconductor substrate is, for example, a silicon substrate, a sapphire (single-crystalline aluminum) substrate, or other types of substrate. The glass substrate is, for example, a glass substrate for an FPD (Flat Panel Display), or a glass substrate for a MEMS (Micro Electro Mechanical Systems).

The substrate transferring device 101 is provided with a hand 20, a manipulator 30, and a controlling device 70, and transfers the substrate 1 accommodated in the container 102, while holding it by the hand 20.

Note that, below, although a configuration of a horizontally articulated robot is described as the manipulator 30, the manipulator 30 is not limited to the horizontally articulated robot, but may be one based on a vertically articulated robot.

The manipulator 30 has a casing 50, a plurality of arms (here, a first arm 32 and a second arm 34), an ascendable member 40, a first connecting part 31, a second connecting part 33, and a third connecting part 35.

The ascendable member 40 is provided to an upper part of the casing 50. Moreover, a linear-motion actuator 41 and the controlling device 70 are disposed inside the casing 50. Note that the controlling device 70 may be provided outside the casing 50. The controlling device 70 will be described later.

The linear-motion actuator 41 can cause the ascendable member 40 to ascend and descend (to move vertically). The linear-motion actuator 41 is, for example, an electric motor (a servomotor) together with a ball screw, a linear guide, or a rack and pinion, or may be an air cylinder.

Note that, inside the casing 50, for example, a rotary sensor which detects a rotational position of the electric motor and outputs it to the controlling device 70, and a current sensor which detects current for controlling a rotation of a drive motor may be provided.

A base-end part of the first arm 32 is connected to the ascendable member 40 via the first connecting part 31 so as to be rotatable about a rotary axis L1 passing through an axial center of the ascendable member 40. In detail, the ascendable member 40 is provided with, for example, a drive motor which rotates the first arm 32, and a rotary sensor which detects a rotational position of the drive motor. Note that the drive motor etc. may be provided to the first arm 32.

A base-end part of the second arm 34 is connected to a tip-end part of the first arm 32 via the second connecting part 33 so as to be rotatable about a rotary axis L2. In detail, the first arm 32 is provided with, for example, a drive motor which rotates the second arm 34, and a rotary sensor which detects a rotational position of the drive motor. Note that the drive motor etc. may be provided to the second arm 34.

Moreover, the hand 20 is connected to a tip-end part of the second arm 34 via the third connecting part 35 so as to be rotatable about a rotary axis L3. The second arm 34 is provided with, for example, a drive motor which rotates the hand 20, and a rotary sensor which detects a rotational position of the drive motor.

The hand 20 has a body part 21 and claw parts 22. The body part 21 is formed in a substantially Y-shape when seen from above, and includes a pair of finger parts 21A and 21B. The finger parts 21A and 21B are provided, at their tip-end parts and base-end parts, with the claw parts 22, respectively. Each claw part 22 is formed in an L-shape when seen horizontally (formed to have an L-shaped cross section in a vertical direction), and the substrate 1 is placed on a bottom part of the claw part 22. Note that the hand 20 may be configured so that the hand 20 and the substrate 1 do not relatively displace, like an edge-gripping hand or a sucking hand.

Moreover, each of the finger parts 21A and 21B of the body part 21 is provided with a substrate detector 60 at its tip-end part. Each substrate detector 60 has a first light-emitting part 61 and a first light-receiving part 62. The substrate detector 60 receives light, which is emitted from the first light-emitting part 61 and reflected on a principal surface of the substrate 1, by the first light-receiving part 62, and outputs information whether the light is received, to the controlling device 70.

Note that in Embodiment 1 the first light-emitting part 61 upwardly emits light (toward a lower surface of the substrate 1).

Here, whether or not the light is received by the substrate detector 60 is described in more detail with reference to FIGS. 3 and 4.

Figure 3:
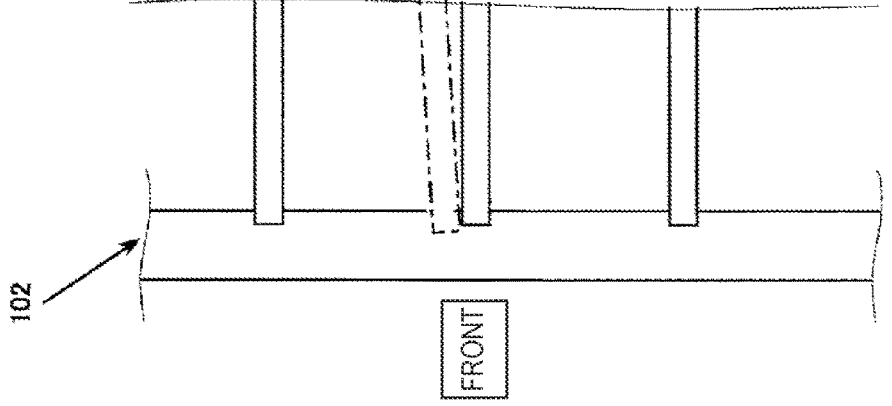
FIG. 3 is an enlarged schematic view of a substantial part of the robot system illustrated in FIG. 1.
Figure 4:
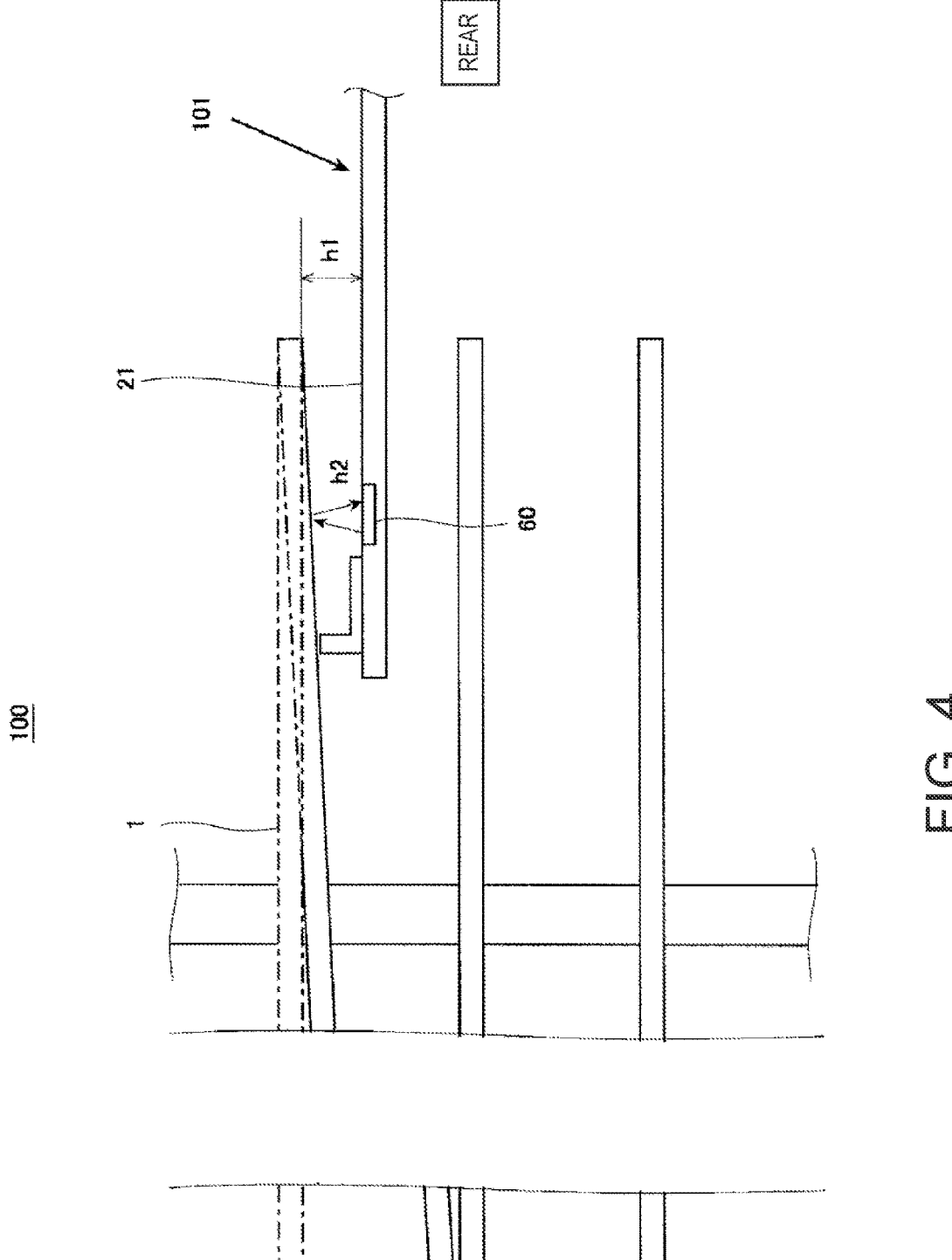
FIG. 4 is an enlarged schematic view of the substantial part of the robot system illustrated in FIG. 1.

FIGS. 3 and 4 are enlarged schematic views of a substantial part of the robot system illustrated in FIG. 1. FIG. 3 illustrates the substrate detector 60 which receives, by the first light-receiving part 62, the light reflected on the principal surface of the substrate 1 when the substrate 1 is correctly accommodated in the container 102. FIG. 4 illustrates the substrate detector 60 which does not receive, by the first light-receiving part 62, the light reflected on the principal surface of the substrate 1 when the substrate 1 is correctly accommodated in the container 102.

Note that the controlling device 70 is assumed to have been taught operation of the substrate transferring device 101 through a teaching by a worker and/or an automatic teaching by the controlling device 70, so that an upper surface of the body part 21 is located at a given first distance h1 (set in advance) below the lower surface of the substrate 1. The first distance h1 can be set arbitrary as long as it is smaller than a distance between the substrates 1 adjacent to each other.

As illustrated in FIG. 3, the substrate detector 60 receives, by the first light-receiving part 62, the light reflected on the principal surface of the substrate 1 when the substrate 1 is correctly accommodated in the container 102. In other words, the substrate detector 60 receives, by the first light-receiving part 62, the light reflected on the principal surface of the substrate 1 when the principal surface of the substrate 1 is located at the first distance h1.

Then, as indicated by a one-dot chain line in FIG. 3, when a position of the substrate 1 deviates on a farther side inside the container 102 (frontward of the substrate transferring device 101), the first light-receiving part 62 cannot receive the light reflected on the principal surface of the substrate 1.

On the other hand, the substrate detector 60 illustrated in FIG. 4 receives, by the first light-receiving part 62, the light reflected on the principal surface of the substrate 1 when the substrate 1 is not correctly accommodated in the container 102 (i.e., when the positional deviation occurs). In other words, the substrate detector 60 receives, by the first light-receiving part 62, the light reflected on the principal surface of the substrate 1 when the principal surface of the substrate 1 is located at a second distance h2, which is smaller than the first distance h1.

Then, as indicated by a one-dot chain line in FIG. 4, when the substrate 1 is correctly accommodated in the container 102, the substrate detector 60 cannot receive the light reflected on the principal surface of the substrate 1.

Therefore, the controlling device 70 can determine the positional deviation of the substrate 1 based on whether the first light-receiving part 62 of the substrate detector 60 receives the reflected light.

Note that although in Embodiment 1 the substrate detector 60 is provided to each of the finger parts 21A and 21B, it is not limited to this, and may be provided to one of the finger parts 21A and 21B.

Moreover, one of the finger parts 21A and 21B may be provided with the substrate detector 60 having the first light-receiving part 62 receivable of the reflected light when the substrate 1 is correctly accommodated, and the other finger part may be provided with the substrate detector 60 having the first light-receiving part 62 unreceivable of the reflected light when the substrate 1 is correctly accommodated.

The controlling device 70 is provided with a processor, such as a microprocessor or a CPU, and a memory, such as a ROM and a RAM (none of them are illustrated). The memory stores information on a basic program, various fixed data, etc. The processor reads software, such as the basic program stored in the memory, and executes it to control various operations of the robot system 100.

Note that the controlling device 70 may be comprised of a sole controlling device 70 which executes a centralized control, or a plurality of controlling devices 70 which cooperatively execute a distributed control. Moreover, the controlling device 70 may be comprised of a microcomputer, or comprised of an MPU, a PLC (Programmable Logic Controller), a logic circuit, etc.

[Operation and Effects of Substrate Transferring Device]

Next, operation of the substrate transferring device 101 according to Embodiment 1 and its effects are described with reference to FIGS. 1 to 6.

Figure 5:
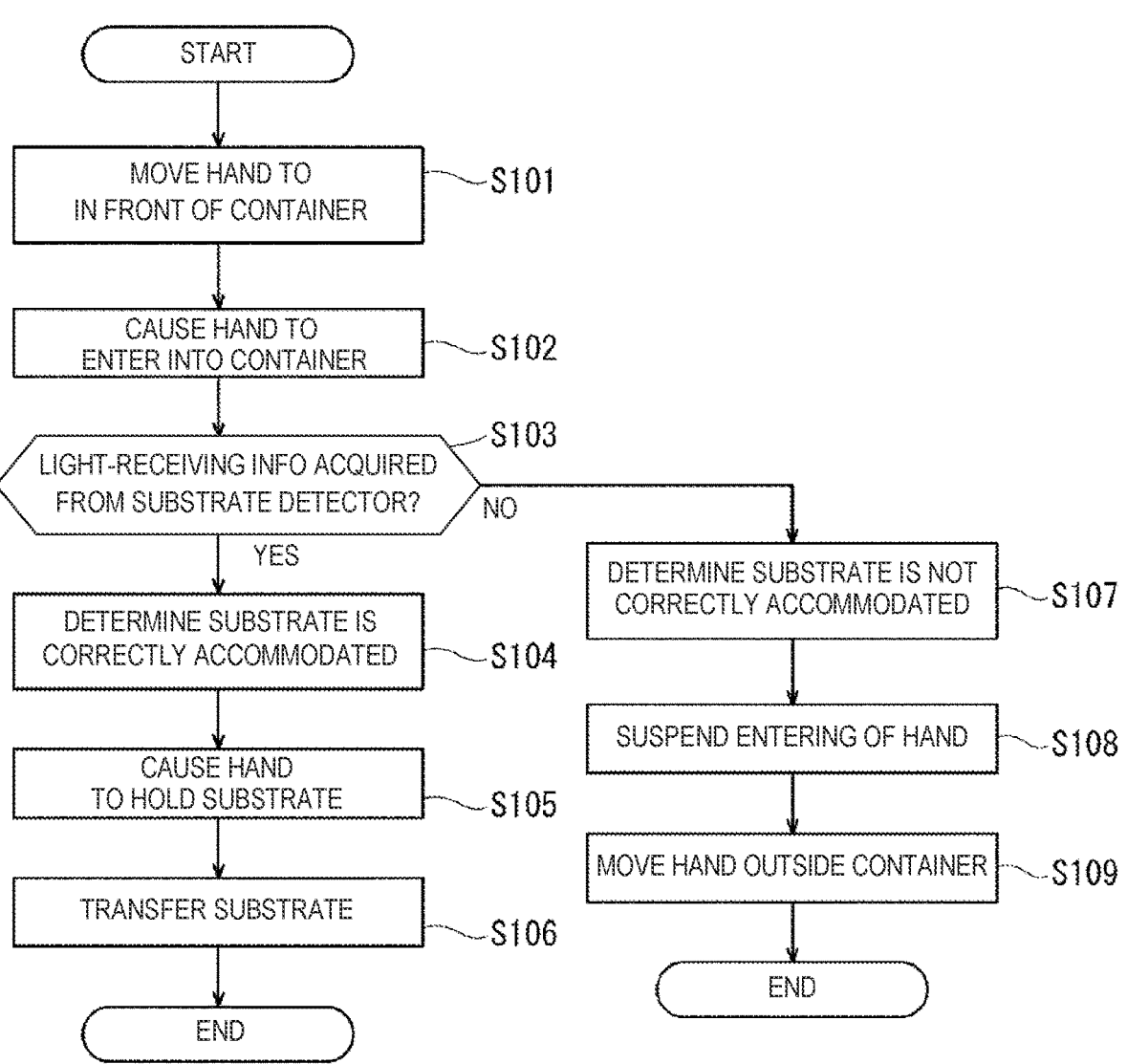
FIG. 5 is a flowchart illustrating one example of operation of the substrate transferring device according to Embodiment 1.

FIG. 5 is a flowchart illustrating one example of the operation of the substrate transferring device according to Embodiment 1. FIG. 5 illustrates a flowchart when the substrate transferring device 101 is provided with the substrate detector 60 having the first light-receiving part 62 receivable of the reflected light when the substrate 1 is correctly accommodated.

First, the controlling device 70 is assumed to have received an input of command information from an operator via an input device (not illustrated), for gripping the substrate 1 placed inside the container 102 and transferring it.

Then, as illustrated in FIG. 5, the controlling device 70 operates the manipulator 30 to move the hand 20 to a position in front of the container 102 (Step S101). Then, the controlling device 70 operates the manipulator 30 to enter the hand 20 into the container 102 (Step S102). At this time, the controlling device 70 determines whether light-receiving information, indicative of the reception of the light reflected on the substrate 1 by the first light-receiving part 62, is acquired from the substrate detector 60 (Step S103).

If the controlling device 70 determines that the light-receiving information is acquired from the substrate detector 60 (YES at Step S103), the substrate 1 is determined to be correctly accommodated (Step S104). Then, the controlling device 70 operates the manipulator 30 to hold the substrate 1 by the hand 20 (Step S105).

Next, the controlling device 70 operates the manipulator 30 to transfer the substrate 1 to a given position set in advance, and place the substrate 1 at the given position (Step S106), and ends this program.

On the other hand, at Step S103, if the controlling device 70 determines that the light-receiving information is not acquired from the substrate detector 60 (NO at Step S103), it determines that the substrate 1 is not correctly accommodated (Step S107). Then, the controlling device 70 suspends the entering of the hand 20 into the container 102 (Step S108). In detail, the controlling device 70 suspends the operation of the manipulator 30.

Next, the controlling device 70 operates the manipulator 30 to move the hand 20 outside the container 102 (Step S109), and ends this program. Note that the controlling device 70 may notify the worker etc., that the substrate 1 is not correctly accommodated by a notifying device (not illustrated). The notifying device is, for example, a display unit such as a display, a speaker, or a siren.

Figure 6:
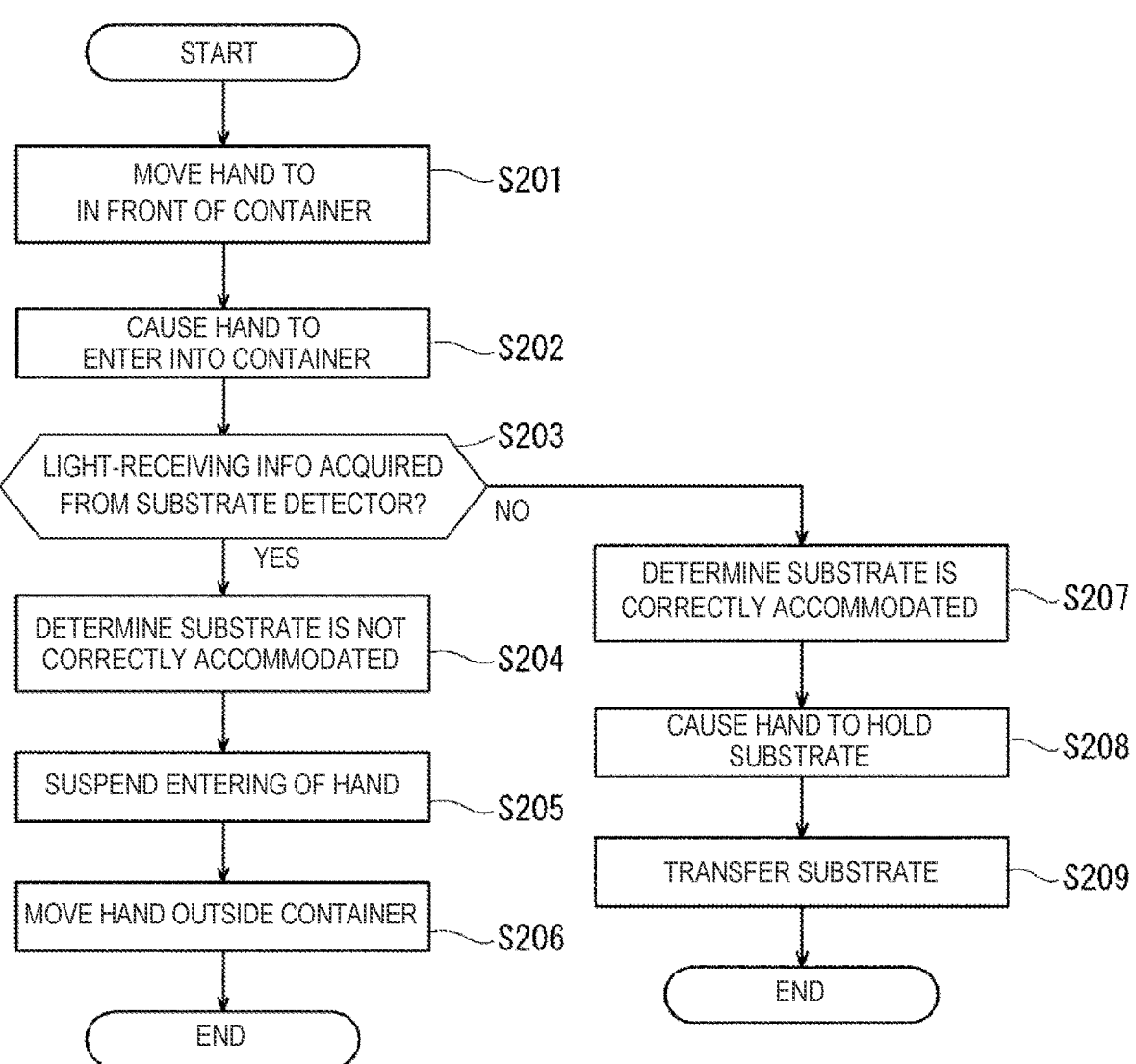
FIG. 6 is a flowchart illustrating another example of the operation of the substrate transferring device according to Embodiment 1.

FIG. 6 is a flowchart illustrating another example of the operation of the substrate transferring device according to Embodiment 1. FIG. 6 illustrates a flowchart when the substrate transferring device 101 is provided with the substrate detector 60 having the first light-receiving part 62 unreceivable of the reflected light when the substrate 1 is correctly accommodated.

First, the controlling device 70 is assumed to have received the input of the command information from the operator via the input device (not illustrated), for gripping the substrate 1 placed inside the container 102 and transferring it.

Then, as illustrated in FIG. 6, the controlling device 70 operates the manipulator 30 to move the hand 20 to the position in front of the container 102 (Step S201). Then, the controlling device 70 operates the manipulator 30 to enter the hand 20 into the container 102 (Step S202). At this time, the controlling device 70 determines whether the light-receiving information, indicative of the reception of the light reflected on the substrate 1 by the first light-receiving part 62, is acquired from the substrate detector 60 (Step S203).

If the controlling device 70 determines that the light-receiving information is acquired from the substrate detector 60 (YES at Step S203), it determines that the substrate 1 is not correctly accommodated (Step S204). Then, the controlling device 70 suspends the entering of the hand 20 into the container 102 (Step S205). In detail, the controlling device 70 suspends the operation of the manipulator 30.

Next, the controlling device 70 operates the manipulator 30 to move (evacuate) the hand 20 outside the container 102 (Step S206), and ends this program. Note that the controlling device 70 may notify the worker etc., that the substrate 1 is not correctly accommodated by the notifying device (not illustrated). The notifying device is, for example, a display unit such as a display, a speaker, or a siren.

On the other hand, if the controlling device 70 determines that the light-receiving information is not acquired from the substrate detector 60 (NO at Step S203), it determines that the substrate 1 is correctly accommodated (Step S207). Then, the controlling device 70 operates the manipulator 30 to hold the substrate 1 by the hand 20 (Step S208).

Next, the controlling device 70 operates the manipulator 30 to transfer the substrate 1 to the given position set in advance, and place the substrate 1 at the given position (Step S209), and ends this program.

In the substrate transferring device 101 according to Embodiment 1 configured as described above, the controlling device 70 causes the first light-emitting part 61 of the substrate detector 60 to emit the light toward the principal surface of the substrate 1 while the controlling device 70 operates the manipulator 30 to enter the hand 20 into the container 102. Then, the controlling device 70 determines the occurrence of the positional deviation of the substrate 1 based on whether the first light-receiving part 62 of the substrate detector 60 receives the light reflected on the principal surface of the substrate 1.

Therefore, even when the position of the substrate 1 deviates on the farther side in the container 102, the positional deviation can be detected.

Particularly, when the substrates 1 increases in the size (e.g., with a diameter of 30 cm), and the distance between the adjacent substrates 1 is smaller (e.g., the distance between the substrates 1 is 6 to 20 mm), an inclining angle of the substrate 1 due to its positional deviation is smaller. Therefore, on a near side of the container 102 (on a side closer to the substrate transferring device 101), a position of an outer circumferential surface (a side surface) of the substrate 1 hardly changes, compared to when the substrate 1 is correctly accommodated (see FIGS. 3 and 4).

Thus, the positional deviation is difficult to be detected even when, similarly to the substrate processing device disclosed in Patent Document 1, the position of the substrate 1 is detected at the near-side part of the container 102.

On the other hand, in the substrate transferring device 101 according to Embodiment 1, the controlling device 70 determines whether the positional deviation of the substrate 1 occurs based on whether the first light-receiving part 62 of the substrate detector 60 detects the light reflected on the principal surface of the substrate 1, while the hand 20 is being entered into the container 102.

Therefore, compared to the substrate processing device disclosed in Patent Document 1, the positional deviation can be detected even when the position of the substrate 1 deviates on the farther side in the container 102.

[Modification 1]

Next, a modification of the substrate transferring device 101 according to Embodiment 1 is described with reference to FIGS. 7 and 8.

A substrate transferring device according to Modification 1 of Embodiment 1 is configured so that a first light-emitting part of a substrate detector downwardly emits the light.

Figure 7:
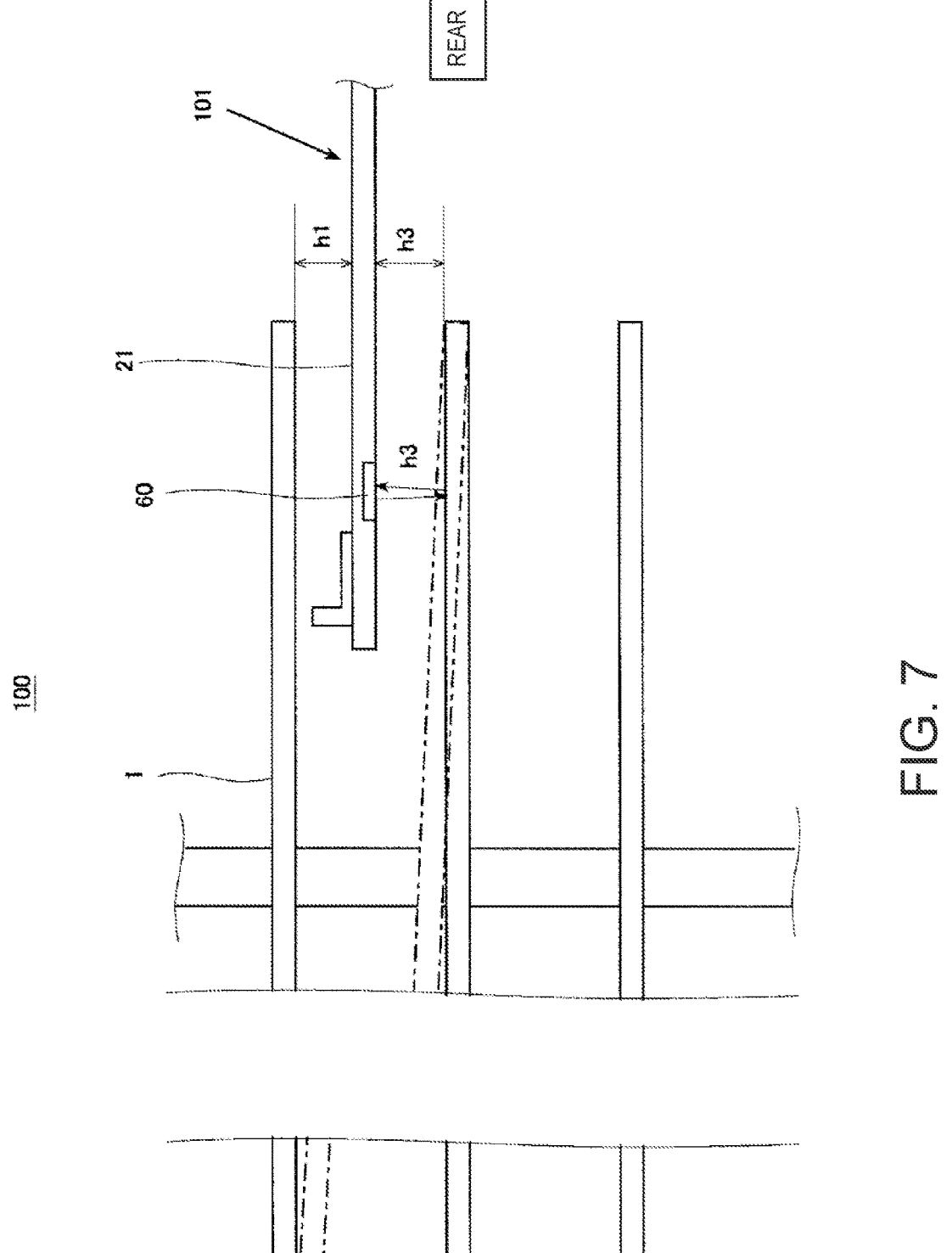
FIG. 7 is a schematic view illustrating an outline configuration of a substantial part of a substrate transferring device of Modification 1 of Embodiment 1.
Figure 8:
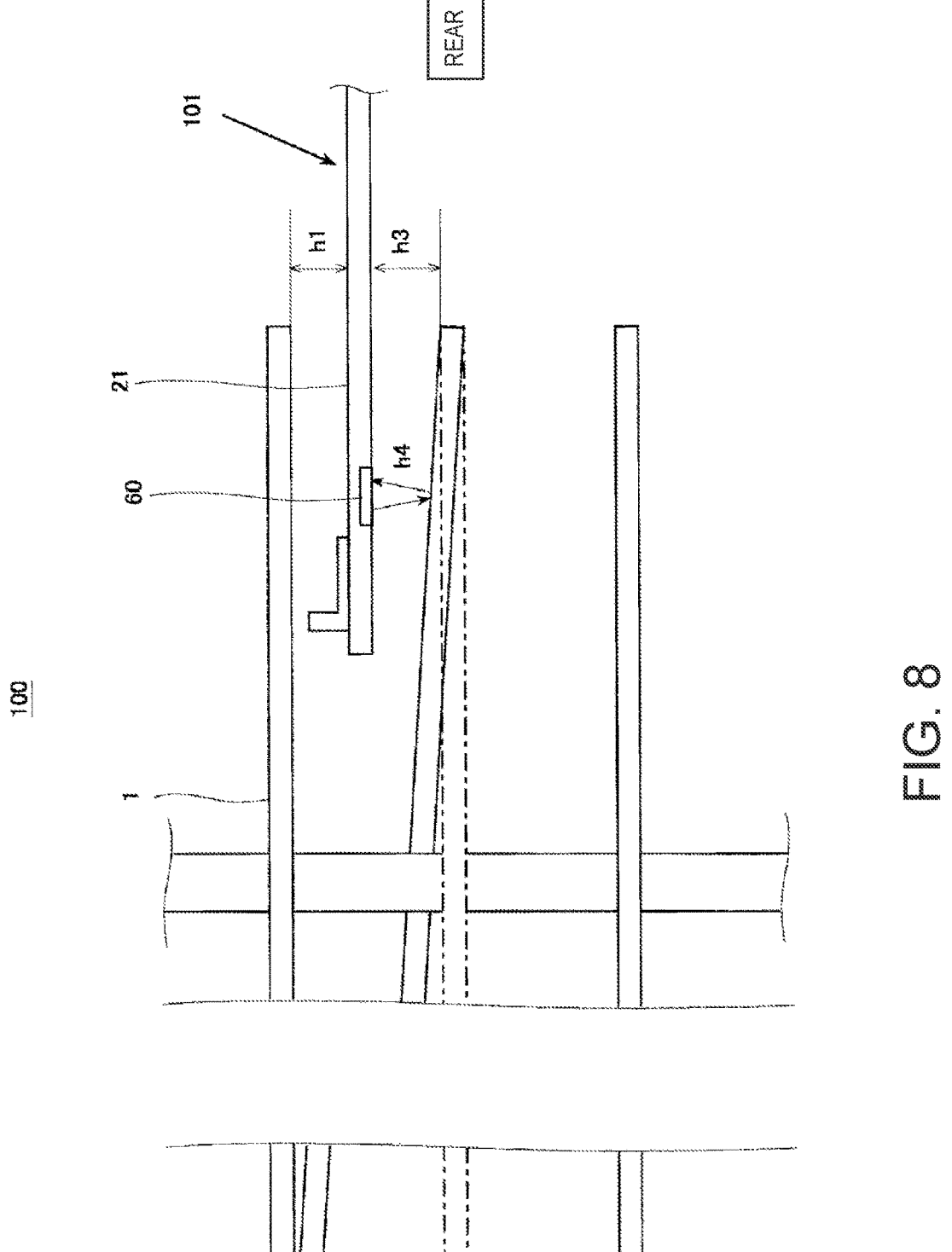
FIG. 8 is a schematic view illustrating an outline configuration of a substantial part of the substrate transferring device of Modification 1 of Embodiment 1.

FIGS. 7 and 8 are schematic views illustrating an outline configuration of a substantial part of the substrate transferring device of Modification 1 of Embodiment 1. FIG. 7 illustrates the substrate detector 60 which receives, by the first light-receiving part 62, the light reflected on the principal surface of the substrate 1 when the substrate 1 is correctly accommodated in the container 102. FIG. 8 illustrates the substrate detector 60 which does not receive, by the first light-receiving part 62, the light reflected on the principal surface of the substrate 1 when the substrate 1 is correctly accommodated in the container 102.

Note that, similar to Embodiment 1, the controlling device 70 is assumed to have been taught the operation of the substrate transferring device 101 through the teaching by the worker and/or the automatic teaching by the controlling device 70, so that the upper surface of the body part 21 is located at the given first distance h1 (set in advance) below the lower surface of the substrate 1. Moreover, when the upper surface of the body part 21 is located at the first distance h1 below the lower surface of the substrate 1, a distance between a lower surface of the body part 21 and an upper surface of a substrate 1 located below the body part 21, is defined as a third distance h3.

As illustrated in FIGS. 7 and 8, although a basic configuration of the substrate transferring device 101 of Modification 1 is the same as that of the substrate transferring device 101 of Embodiment 1, it is different in that the first light-emitting part 61 of the substrate detector 60 emits the light downwardly (toward the upper surface of the substrate 1).

In FIG. 7, the substrate detector 60 receives, by the first light-receiving part 62, the light reflected on the principal surface of the substrate 1 when the substrate 1 is correctly accommodated in the container 102. The substrate detector 60 receives, by the first light-receiving part 62, the light reflected on the principal surface of the substrate 1 when the principal surface of the substrate 1 is located at the third distance h3.

Then, as indicated by a one-dot chain line in FIG. 7, the first light-receiving part 62 cannot receive the light reflected on the principal surface of the substrate 1 when the positional deviation of the substrate 1 occurs on the farther side in the container 102 (frontward of the substrate transferring device 101).

On the other hand, the substrate detector 60 illustrated in FIG. 8 receives, by the first light-receiving part 62, the light reflected on the principal surface of the substrate 1 when the substrate 1 is not correctly accommodated in the container 102 (i.e., when the positional deviation occurs). In other words, the substrate detector 60 receives, by the first light-receiving part 62, the light reflected on the principal surface of the substrate 1 when the principal surface of the substrate 1 is located at a fourth distance h4, which is smaller than the third distance h3.

Then, as indicated by a one-dot chain line in FIG. 8, the substrate detector 60 cannot receive, by the first light-receiving part 62, the light reflected on the principal surface of the substrate 1 when the substrate 1 is correctly accommodated in the container 102.

The substrate transferring device 101 of Modification 1 configured as described above also can achieve similar operation and effects to the substrate transferring device 101 of Embodiment 1.

Embodiment 2

A substrate transferring device according to Embodiment 2 is configured such that, in the substrate transferring device of Embodiment 1, a mapping device having a second light-emitting part which horizontally emits light, and a second light-receiving part which receives the light emitted from the second light-emitting part, is provided to the tip-end part of the hand. The controlling device acquires, from the mapping device, positional information indicating that the second light-receiving part does not detect light emitted from the second light-emitting part as positional information on the substrate. The controlling device operates the manipulator based on the positional information on the substrate acquired from the mapping device so as to position the hand at the first distance (set in advance) below a lower surface of the substrate.

Moreover, in the substrate transferring device according to Embodiment 2, the substrate detector may receive the light reflected on the principal surface of the substrate by the first light-receiving part, when the principal surface of the substrate is located at the second distance smaller than the first distance. The controlling device may cause the first light-emitting part of the substrate detector to emit the light toward the principal surface of the substrate while the controlling device operates the manipulator to enter the hand into the container, and determine that the positional deviation of the substrate occurs when the first light-receiving part of the substrate detector receives the light reflected on the principal surface of the substrate.

Moreover, in the substrate transferring device according to Embodiment 2, the substrate detector may receive the light reflected on the principal surface of the substrate by the first light-receiving part, when the principal surface of the substrate is located at the second distance smaller than the first distance. The controlling device may cause the first light-emitting part of the substrate detector to emit the light toward the principal surface of the substrate while the controlling device operates the manipulator to enter the hand into the container, and determine that the positional deviation of the substrate does not occur when the first light-receiving part of the substrate detector does not receive the light reflected on the principal surface of the substrate.

Below, one example of the substrate transferring device according to Embodiment 2 is described with reference to FIG. 9.

[Configuration of Substrate Transferring Device]

Figure 9:
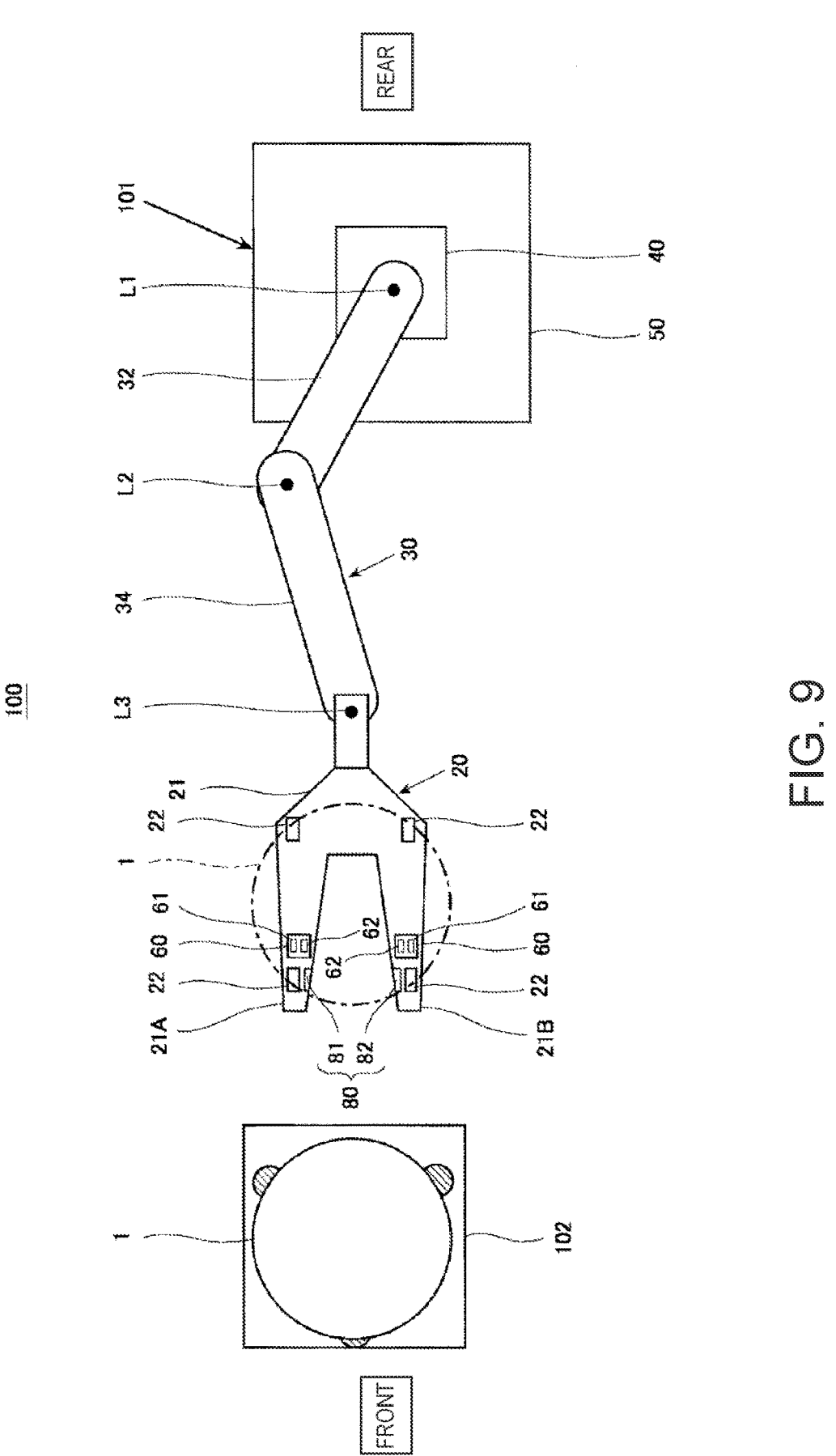
FIG. 9 is a top view schematically illustrating the outline configuration of the substrate transferring device and a robot system having the substrate transferring device according to Embodiment 2.

FIG. 9 is a top view schematically illustrating an outline configuration of the substrate transferring device and a robot system having it according to Embodiment 2. Note that, in FIG. 9, a front-and-rear direction of the substrate transferring device is indicated as a front-and-rear direction in the drawing.

As illustrated in FIG. 9, although a basic configuration of the substrate transferring device 101 according to Embodiment 2 is the same as that of the substrate transferring device 101 of Embodiment 1, it is different in that a mapping device 80 is provided to the tip-end part of the base body 21.

The mapping device 80 has a second light-emitting part 81 which horizontally emits light, and a second light-receiving part 82 which receives the light emitted from the second light-emitting part 81. The second light-emitting part 81 is provided to the finger part 21A of the body part 21, and the second light-receiving part 82 is provided to the finger part 21B of the base body 21. In other words, the second light-emitting part 81 and the second light-receiving part 82 are provided so as to face to each other.

Moreover, the mapping device 80 outputs to the controlling device 70 positional information indicating that the second light-receiving part 82 does not detect the light emitted from the second light-emitting part 81, as positional information on the substrate 1. Therefore, the controlling device 70 can more accurately acquire the positional information on the substrate 1.

The controlling device 70 operates the manipulator 30 so that the hand 20 is located at the first distance h1 below the lower surface of the substrate 1, based on the positional information on the substrate 1 acquired from the mapping device 80. Accordingly, the controlling device 70 can position the hand 20 at the first distance h1 below the lower surface of the substrate 1 more accurately compared to the substrate transferring device 101 according to Embodiment 1.

Note that since operation of the substrate transferring device 101 according to Embodiment 2 is the same as that of the substrate transferring device 101 according to Embodiment 1, detailed description thereof is omitted.

The substrate transferring device 101 according to Embodiment 2 configured as described above also can achieve similar operation and effects to the substrate transferring device 101 according to Embodiment 1.

Embodiment 3

Figure 10:
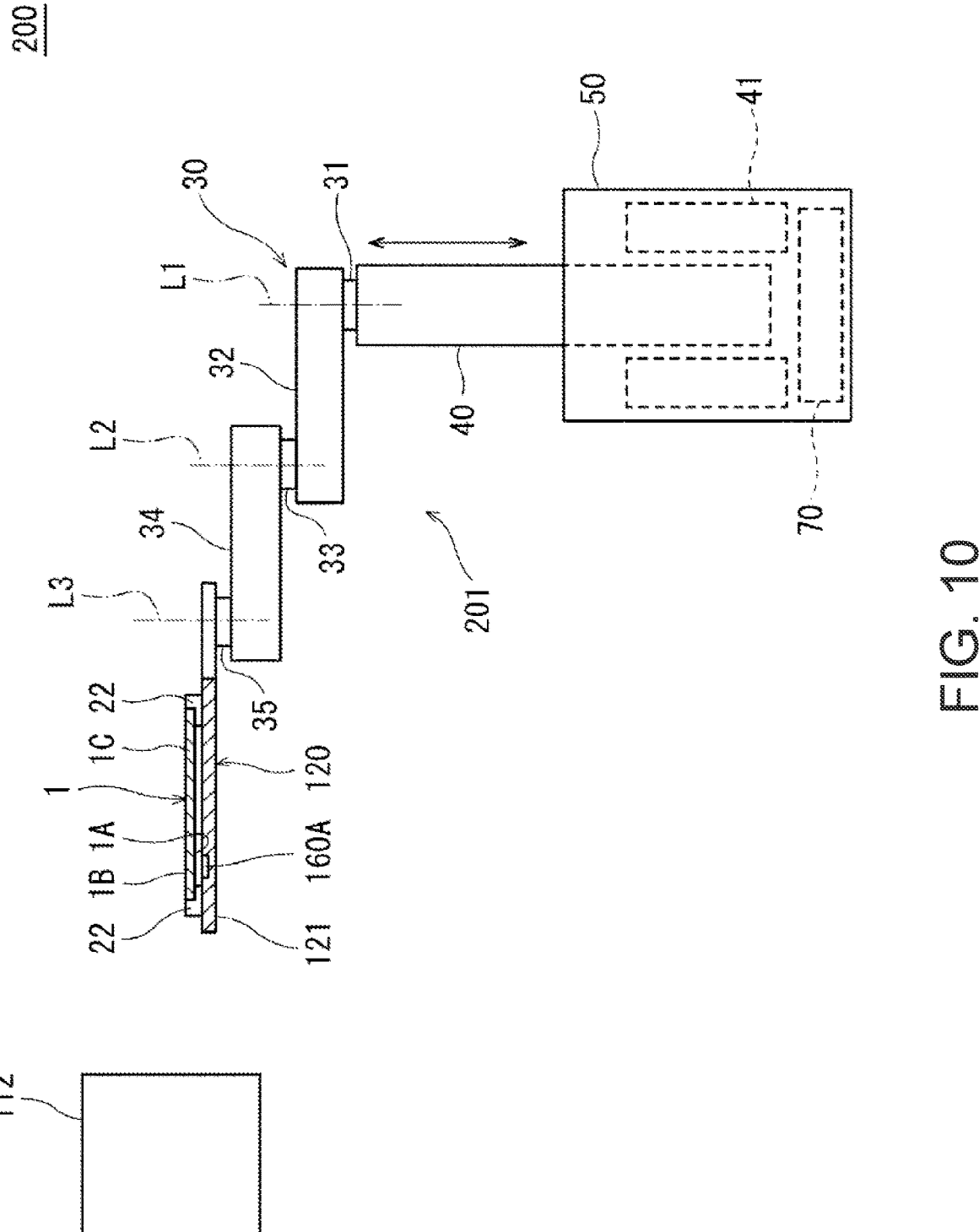
FIG. 10 is a side view schematically illustrating an outline configuration of a substrate transferring device and a robot system having the substrate transferring device according to Embodiment 3.
Figure 11:
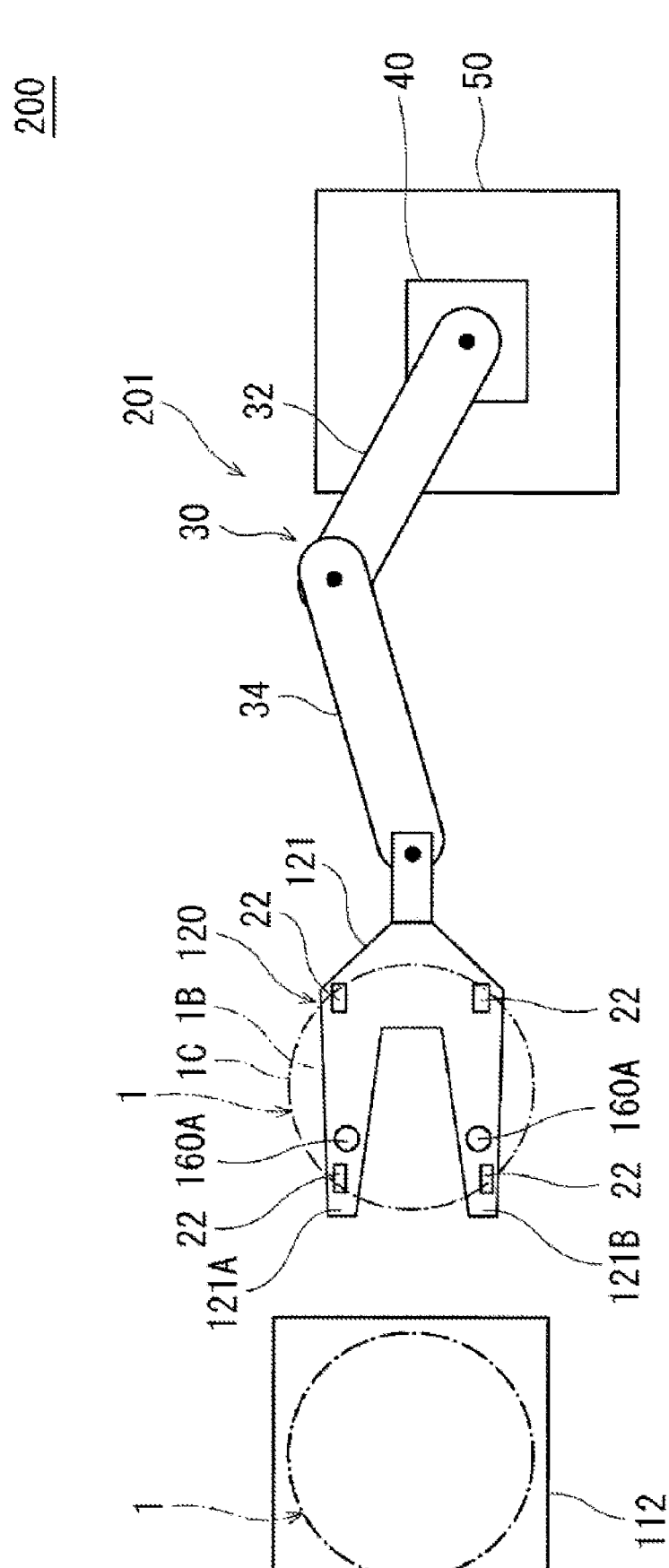
FIG. 11 is a top view schematically illustrating the outline configuration of the robot system illustrated in FIG. 10.

As illustrated in FIGS. 10 and 11, a robot system 200 includes a substrate transferring device 201 and a container 112 as a placing stand. In this robot system 200, the substrate 1 is placed on the placing stand by being accommodated in the container 112. The container 112 is, for example, a FOUP (Front Opening Unified Pod), or a quartz boat.

A left-and-right direction and an up-and-down direction in FIG. 10 indicate a front-and-rear direction and an up-and-down direction of the substrate transferring device 201. Moreover, a left-and-right direction in FIG. 11 indicates the front-and-rear direction of the substrate transferring device 201. Downward in an up-and-down direction in FIG. 11 indicates leftward in the left-and-right direction of the substrate transferring device 201.

The substrate 1 is, for example, a substrate for a semiconductor device, such as a semiconductor substrate and a glass substrate. This substrate 1 is, for example, a circular thin plate. The substrate 1 has a pair of circular principal surfaces 1A and 1B, and an outer circumferential surface 1C between the principal surface 1A and the principal surface 1B. The substrate 1 is, for example, a thin plate in a polygonal shape, and may have any shape as long as it has a thin-plate shape. The semiconductor substrate is, for example, a silicon substrate, a sapphire (single-crystalline aluminum) substrate, or another type of substrate. The glass substrate is, for example, a glass substrate for an FPD (Flat Panel Display), or a glass substrate for a MEMS (Micro Electro Mechanical Systems).

The substrate transferring device 201 is provided with a hand 120, the manipulator 30, and the controlling device 70. The substrate transferring device 201 holds the substrate 1 accommodated in the container 112 by the hand 120. The hand 120 is attached to the manipulator 30. This manipulator 30 moves the hand 120 to transfer the substrate 1. In FIG. 10, the substrate 1 is held by the hand 120.

Note that, below, although a configuration of a horizontally articulated robot is described as the manipulator 30, the manipulator 30 according to the present disclosure is not limited to the horizontally articulated robot, but may be one based on a vertically articulated robot.

The manipulator 30 has the plurality of arms (here, the first arm 32 and the second arm 34), the first connecting part 31, the second connecting part 33, the third connecting part 35, the ascendable member 40, and the casing 50.

The ascendable member 40 is provided to the upper part of the casing 50. The ascendable member 40 is vertically movable with respect to the casing 50. Moreover, the linear-motion actuator 41 and the controlling device 70 are disposed inside the casing 50. Note that the controlling device 70 may be provided outside the casing 50.

The linear-motion actuator 41 can cause the ascendable member 40 to ascend and descend (to move vertically). The linear-motion actuator 41 is, for example, a drive motor (a servomotor) together with a ball screw, a linear guide, or a rack and pinion, or may be an air cylinder.

Note that, inside the casing 50, for example, the rotary sensor which detects the rotational position of the drive motor and outputs it to the controlling device 70, and the current sensor which detects current for controlling the rotation of the drive motor may be provided.

The base-end part of the first arm 32 is connected to the ascendable member 40 via the first connecting part 31. The first arm 32 is rotatable about the rotary axis L1 vertically extending and passing through the axial center of the ascendable member 40. The ascendable member 40 is provided with, for example, the drive motor which rotates the first arm 32, and the rotary sensor which detects the rotational position of the drive motor. Note that the drive motor etc. may be provided to the first arm 32.

The base-end part of the second arm 34 is connected to the tip-end part of the first arm 32 via the second connecting part 33. The second arm 34 is rotatable about the rotary axis L2 extending vertically. The first arm 32 is provided with, for example, the drive motor which rotates the second arm 34, and the rotary sensor which detects the rotational position of the drive motor. Note that the drive motor etc. may be provided to the second arm 34.

The hand 120 is connected to the tip-end part of the second arm 34 via the third connecting part 35. The hand 120 is rotatable about the rotary axis L3 extending vertically. The second arm 34 is provided with, for example, the drive motor which rotates the hand 120, and the rotary sensor which detects the rotational position of the drive motor. Note that the drive motor etc. may be provided to the hand 120.

As illustrated in FIG. 11, the hand 120 has a body part 121 and the plurality of claw parts 22. The body part 121 is formed in a substantially Y-shape when seen from above, and includes a pair of finger parts 121A and 121B. The body part 121 is provided, at its tip-end parts (the tip-end parts of the finger parts 121A and 121B) and base-end part, with the claw parts 22, respectively. Each claw part 22 is formed in an L-shape when seen horizontally (formed to have an L-shaped cross section in the vertical direction), and the substrate 1 is placed on the bottom part of the claw part 22. Note that the hand 120 may be configured so that the hand 120 and the substrate 1 do not relatively displace, like as an edge-gripping hand or a sucking hand.

Each of the finger parts 121A and 121B is provided with a substrate detector 160A as a first substrate detector, at its tip-end part. The substrate detectors 160A are provided at the same positions in the front-and-rear direction. Each substrate detector 160A detects a distance to the principal surface 1A of the substrate 1, which is facing thereto. The substrate transferring device 201 uses, for example, a capacitive sensor as the substrate detector 160A. The substrate detector 160A detects a capacitance generated between the substrate detector 160A and the principal surface 1A of the substrate 1 facing to the hand 120. This substrate detector 160A can detect a change in the distance to the principal surface 1A based on a change in the generated capacitance. Note that although here the substrate detectors 160A are provided at the tip-end parts of the body part 121, they may be provided at an intermediate part or the base-end part of the body part 121, as long as they can be faced to the principal surface 1A of the substrate 1.

The controlling device 70 is provided with the processor, such as a microprocessor or a CPU, and the memory, such as a ROM and a RAM (none of them are illustrated). The memory stores information on the basic program, various fixed data, etc. The processor reads the software, such as the basic program, stored in the memory, and executes it to control various operations of the robot system 200.

The controlling device 70 may be comprised of a sole controlling device 70 which executes a centralized control. Alternatively, the controlling device 70 may be comprised of a plurality of controlling devices 70 which cooperatively execute a distributed control. Moreover, the controlling device 70 may be comprised of a microcomputer, or comprised of an MPU, a PLC (Programmable Logic Controller), a logic circuit, etc.

Figure 12:
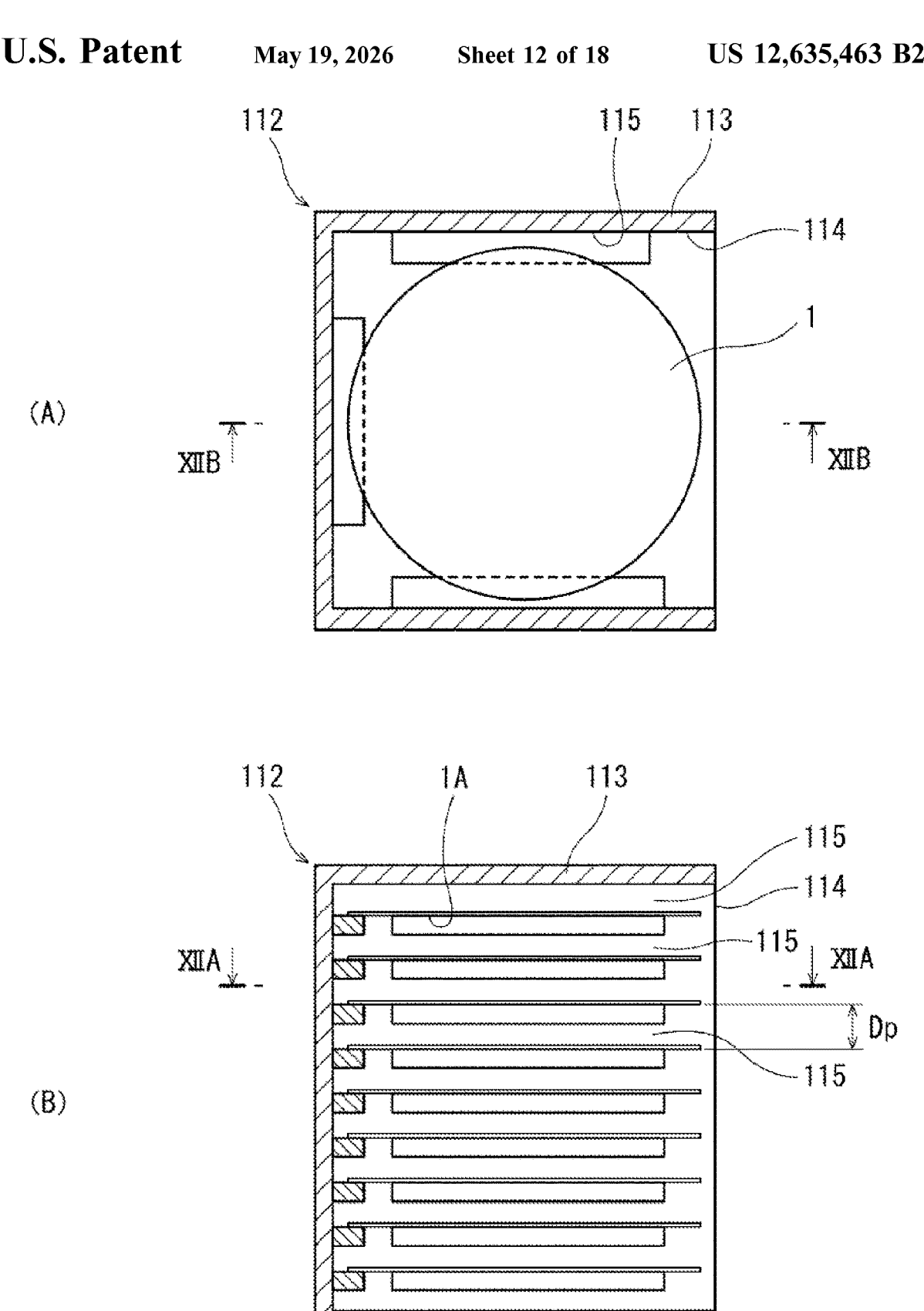
FIG. 12(A) is a cross-sectional view of a container of the robot system taken along a line XIIA-XIIA in FIG. 12(B)
FIG. 12(B) is a cross-sectional view of the container taken along a line XIIB-XIIB in FIG. 12(A).

FIGS. 12(A) and 12(B) illustrate the container 112 together with the substrate 1. The container 112 has a shell 113 in a box-shape. The shell 13 is formed with an opening 114 and a plurality of grooves 115 vertically aligned. Each groove 115 extends horizontally along an inner wall of the shell 113. The groove 115 is supportable of an edge of the principal surface 1A of the substrate 1.

In FIGS. 12(A) and 12(B), the grooves 115 support the principal surfaces 1A of the substrates 1. The plurality of substrates 1 are supported by the grooves 115 while the principal surfaces 1A of the substrates 1 are horizontally parallel with each other. As illustrated in FIG. 12(B), the plurality of substrates 1 are vertically aligned. A double-direction arrow Dp illustrated in FIG. 12(B) indicates a gap between the grooves 115, and the plurality of substrates 1 are vertically aligned in this container 112 having the given gap Dp therebetween. Although the gap Dp is not particularly limited, it is, for example, at 5 mm or above and at 20 mm or below.

Figure 13:
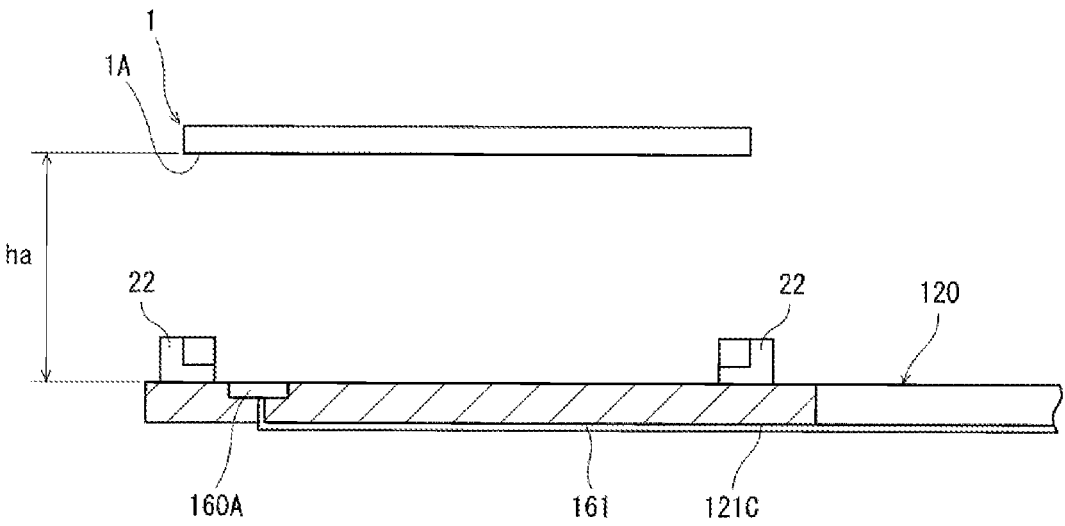
FIG. 13 is an explanatory view illustrating a state where the robot system of FIG. 10 is used.

FIG. 13 illustrates the substrate 1 and the hand 120. Although not being illustrated, the substrate 1 is held at the groove 115 of the container 112. The substrate 1 is held while its principal surface 1A is parallel with the horizontal direction. The substrate detector 160A detects upwardly in the up-and-down direction. The substrate detector 160A is facing to the principal surface 1A. The substrate detector 160A is electrically connected to a capacitance measuring part (not illustrated), and this capacitance measuring part is electrically connected to the controlling device 70. The substrate detector 160A is connected to the capacitance measuring part via an electrical conductor 161 extending along a lower surface 121C of the body part 121 of the hand 120.

A double-direction arrow ha in FIG. 13 indicates a vertical distance between the substrate detector 160A and the principal surface 1A. The capacitance detected by the substrate detector 160A changes according to the change in the distance ha. The substrate detector 160A outputs the detected capacitance to the capacitance measuring part. The capacitance measuring part outputs to the controlling device 70 a voltage signal which varies according to the magnitude of the inputted capacitance.

Figure 14:
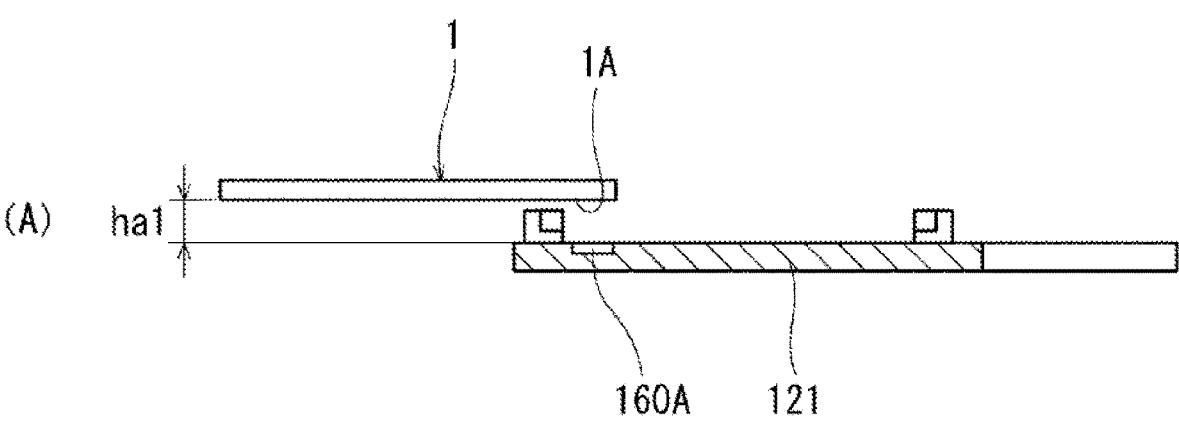
FIG. 14(A) is an explanatory view illustrating another state where the robot system of FIG. 10 is used.
FIG. 14(B) is an explanatory view illustrating still another state where the robot system of FIG. 10 is used.
FIG. 14(C) is an explanatory view illustrating still another state where the robot system of FIG. 10 is used.
Figure 14:
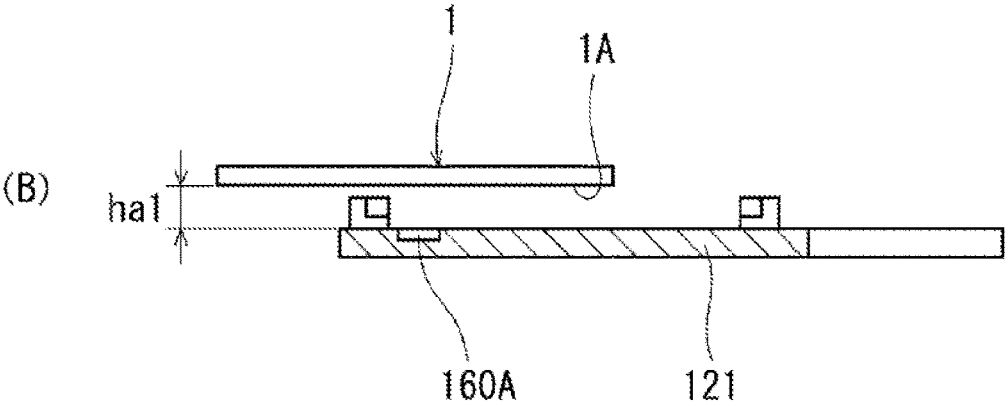
Figure 14:
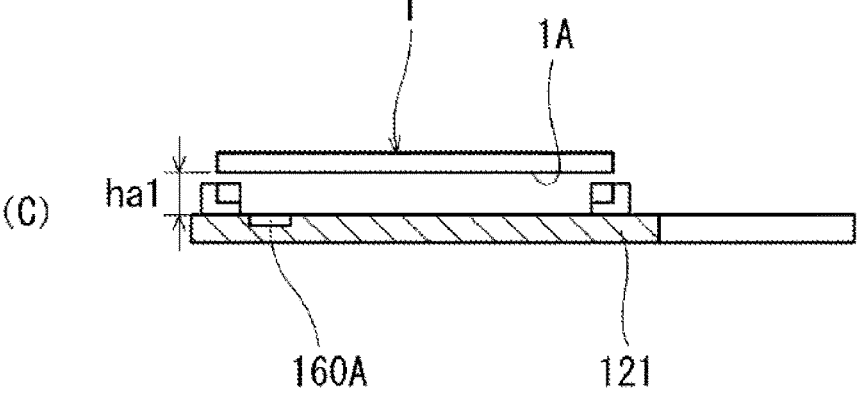

FIGS. 14(A) to 14(C) illustrate the substrate 1 accommodated in the container 112. The principal surface 1A of the substrate 1 extends in parallel with the horizontal direction. The substrate 1 is the one located above and closest to the hand 21. FIG. 14(A) illustrates a state where the tip-end part of the hand 21 is inserted into the container 112 through the opening 114. In FIG. 14(A), the substrate detector 160A is facing to the principal surface 1A of the substrate 1. FIG. 14(B) illustrates a state where the hand 21 is further inserted into the container 112. FIG. 14(C) illustrates a state where the hand 21 is still further inserted into the container 112.

In FIGS. 14(A) to 14(C), the substrate detector 160A is facing to the principal surface 1A of the substrate 1. A double-direction arrow ha1 in FIG. 14(A) indicates the vertical distance between the substrate detector 160A and the principal surface 1A of the substrate 1. From FIG. 14(A) to FIG. 14(C), the hand 120 moves horizontally. Also in FIGS. 14(B) and 14(C), the distance between the substrate detector 160A and the principal surface 1A of the substrate 1 is the distance ha1 same as in FIG. 14(A).

Figure 15:
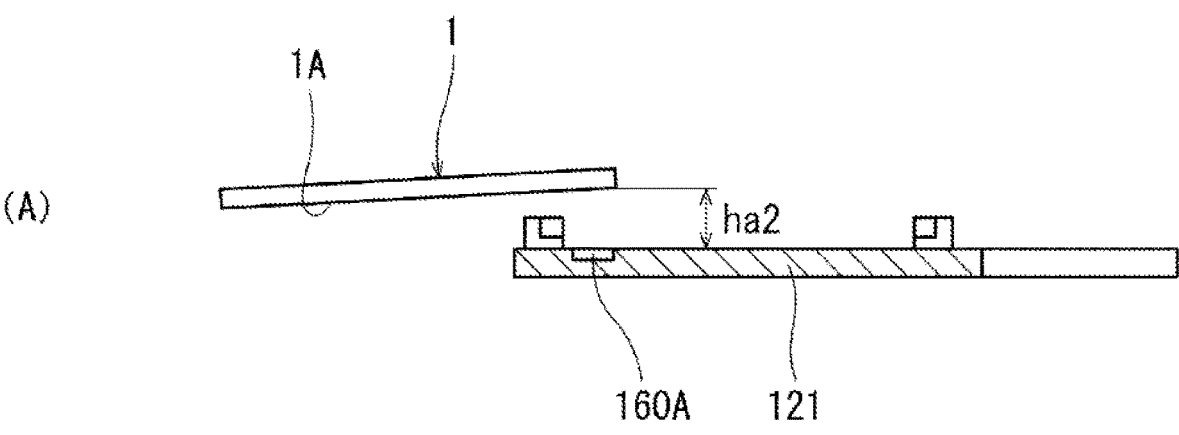
FIG. 15(A) is an explanatory view illustrating still another state where the robot system of FIG. 10 is used.
FIG. 15(B) is an explanatory view illustrating still another state where the robot system of FIG. 10 is used.
FIG. 15(C) is an explanatory view illustrating still another state where the robot system of FIG. 10 is used.
Figure 15:
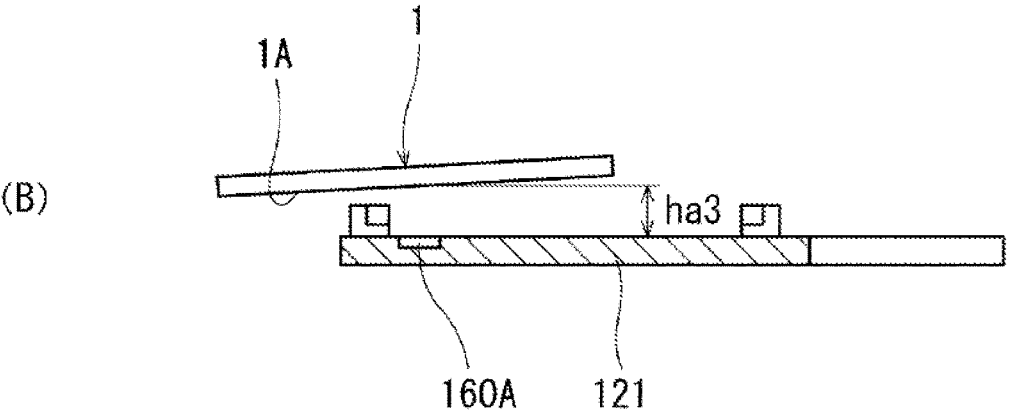
Figure 15:
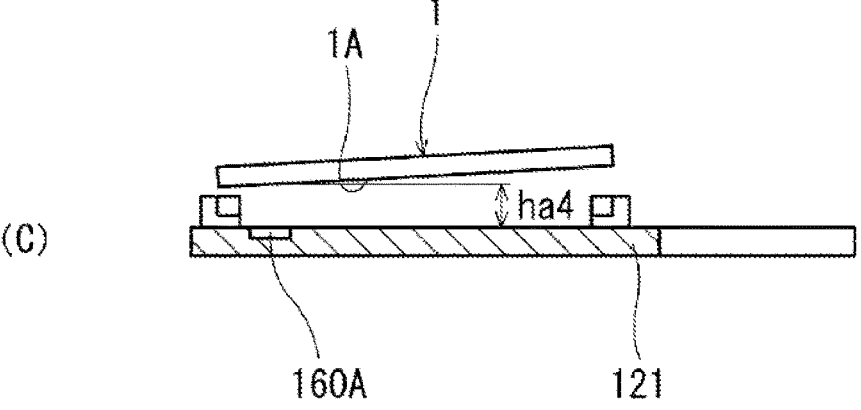

FIGS. 15(A) to 15(C) illustrate another substrate 1 accommodated in the container 112. The principal surface 1A of this substrate 1 extends from the opening 114 toward the farther side while inclining downwardly. In FIGS. 15(A) to 15(C), the other configurations are similar to those in FIGS. 14(A) and 14(B). A double-direction arrow ha2 in FIG. 15(A) indicates the vertical distance between the substrate detector 160A and the principal surface 1A of the substrate 1. A double-direction arrow ha3 in FIG. 15(B) indicates the vertical distance between the substrate detector 160A and the principal surface 1A of the substrate 1. A double-direction arrow ha4 in FIG. 15(C) indicates the vertical distance between the substrate detector 160A and the principal surface 1A of the substrate 1. The distance ha2 is larger than the distance ha3, and the distance ha3 is larger than the distance ha4.

Figure 16:
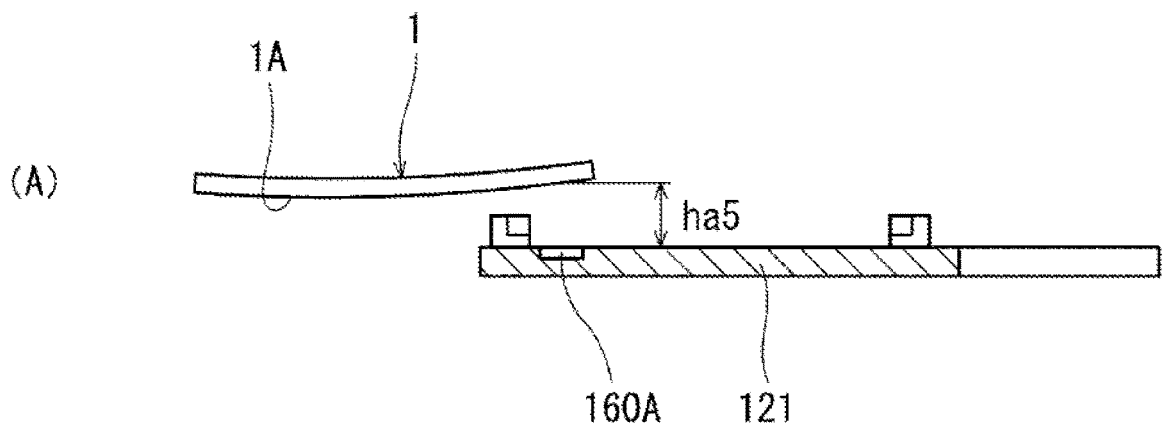
FIG. 16(A) is an explanatory view illustrating still another state where the robot system of FIG. 10 is used.
FIG. 16(B) is an explanatory view illustrating still another state where the robot system of FIG. 10 is used.
FIG. 16(C) is an explanatory view illustrating still another state where the robot system of FIG. 10 is used.
Figure 16:
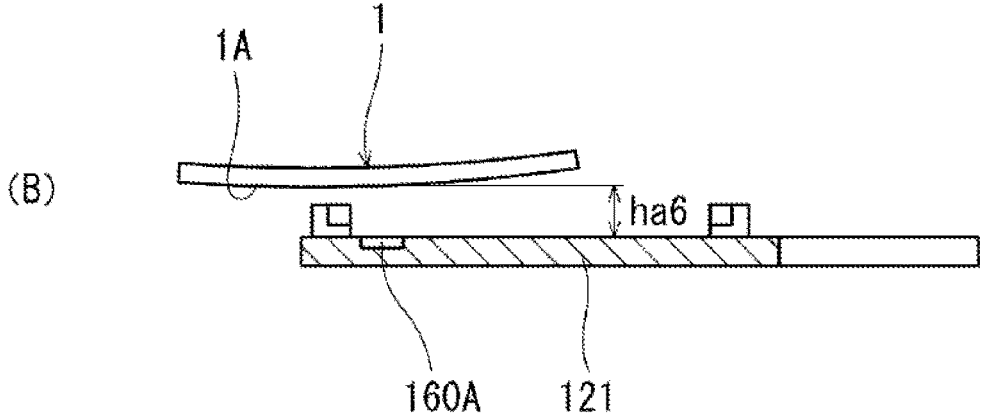
Figure 16:
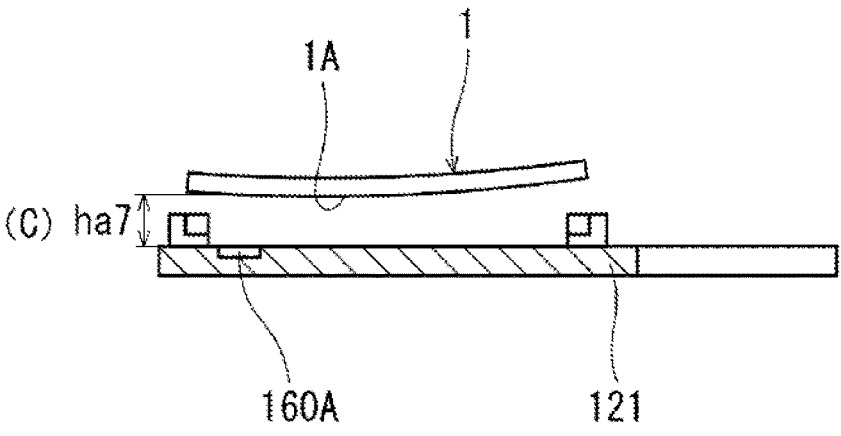

FIGS. 16(A) to 16(C) illustrate still another substrate 1 accommodated in the container 112. This substrate 1 is warped. The principal surface 1A of this substrate 1 is curved in an arc-shape to be bulged downwardly. In FIGS. 16(A) to 16(C), the other configurations are similar to those in FIGS. 14(A) to 14(C). A double-direction arrow ha5 in FIG. 16(A) indicates the vertical distance between the substrate detector 160A and the principal surface 1A of the substrate 1. A double-direction arrow ha6 in FIG. 16(B) indicates the vertical distance between the substrate detector 160A and the principal surface 1A of the substrate 1. A double-direction arrow ha7 in FIG. 16(C) indicates the vertical distance between the substrate detector 160A and the principal surface 1A of the substrate 1. The distance ha5 is larger than the distance ha6, and the distance ha7 is smaller than the distance ha5 and larger than the distance ha6.

Here, a method of operating the substrate transferring device 201 according to the present disclosure is described.

As illustrated in FIGS. 12(A) and 12(B), the container 112 in which the substrates 1 are accommodated is prepared (STEP 1).

The substrate detector 160A detects the distance ha to the principal surface 1A of the substrate 1 (STEP 2). At STEP 2, the hand 120 is internally inserted into the shell 113 of the container 112 through the opening 114. As illustrated in FIG. 14(A), the substrate detector 160A is facing to the principal surface 1A of the substrate 1. The substrate detector 160A detects the distance ha1 to the principal surface 1A as the capacitance.

At STEP 2, the hand 120 is moved from the state in FIG. 14(A) to the state in FIG. 14(B), and then, to the state in FIG. 14(C). The substrate detector 160A detects the distance ha1 as the capacitance while the hand 120 is moved from the state in FIG. 14(A) to the state in FIG. 14(C). The detected capacitance is converted into the voltage signal and outputted to the controlling device 70. The controlling device 70 calculates the distance ha1 based on this voltage signal.

The controlling device 70 determines whether to hold the substrate 1 by the hand 120 (STEP 3). Here, at STEP 3, the distance ha1 falls within a given distance range set in advance. The controlling device 70 determines to hold the substrate 1 by the hand 120.

The controlling device 70 causes the hand 120 to hold the substrate 1 (STEP 4). The substrate 1 is held by the claw parts 22 of the hand 120. At this time, the claw parts 22 contact the edge part of the principal surface 1A.

The substrate 1 held by the hand 120 is transferred to the next processing by the manipulator 30 (STEP 5).

Next, the operating method is described using the substrate 1 in the state illustrated in FIGS. 15(A) to 15(C). At STEP 2 in this operating method, the substrate detector 160A detects the distance ha as the capacitance while the hand 120 is moved from the state in FIG. 15(A) to the state in FIG. 15(C). The generated capacitance increases from the distance ha2 to the distance ha4. The detected capacitance is converted into the voltage signal and outputted to the controlling device 70. The controlling device 70 calculates the distance ha2, the distance ha3, and the distance ha4, based on the voltage signal.

At STEP 3, the distance ha4 is small and does not fall within the given distance range. The controlling device 70 determines not to hold the substrate 1 by the hand 120. The hand 120 is moved back to a given standby position. The controlling device 70 notifies to the worker etc., by a notifying device (not illustrated). The notifying device is, for example, a display unit such as a display, a speaker, or a siren.

Furthermore, the operating method is described using the substrate 1 in the state illustrated in FIGS. 16(A) to 16(C). At STEP2 in this operating method, the substrate detector 160A detects the distance ha as the capacitance while the hand 120 is moved from the state in FIG. 16(A) to the state in FIG. 16(C). The generated capacitance increases from the distance ha5 to the distance ha6. The capacitance reaches the maximum while the distance ha changes from the distance ha6 to the distance ha7, and then, the capacitance decreases toward the distance ha7. The detected capacitance is converted into the voltage signal and outputted to the controlling device 70. The controlling device 70 calculates the distance ha5, the distance ha6, and the distance ha7, based on this voltage signal.

At STEP 3, the distance ha6 is small and does not fall within the given distance range. The controlling device 70 determines not to hold the substrate 1 by the hand 120. The hand 120 is moved back to the given standby position. The controlling device 70 notifies to the worker etc., by the notifying device (not illustrated). The notifying device is, for example, a display unit such as a display, a speaker, or a siren.

The substrate transferring device 201 is provided with the substrate detector 160A which detects the distance ha to the principal surface 1A of the substrate 1. The substrate detector 160A can accurately detect the distance ha to the principal surface 1A, compared to a detector which detects whether the distance ha to the principal surface 1A falls within a given range.

At STEP 2 in the method of operating the substrate transferring device 201, the substrate transferring device 201 can calculate the change in the distance ha while moving the hand 120. The substrate transferring device 201 can suspend the movement of the hand 12 when the distance ha becomes below a lower limit. This substrate transferring device 201 can avoid interference between the hand 120 and the substrate 1 beforehand. Moreover, when the distance ha becomes below the given lower limit, it can be notified to the worker etc. by the notifying device (not illustrated). This substrate transferring device 201 can easily confirm the substrate 1 interfering with the hand 120.

The substrate detector 160A is provided to the hand 120. The hand 120 is inserted into the small gap Dp between the substrates 1. Therefore, the substrate detector 160A is preferably small in the size and weight. The substrate detector 160 is preferably thin. Moreover, the substrate detector 160 is preferably formable in a desired shape corresponding to a shape of a surface of the hand 120. Also in these respects, the capacitive sensor is suitable as the substrate detector 160A.

At STEP 2 in this operating method, when the distance ha calculated by the substrate detector 160A is below the given lower limit, a moving path of the hand 120 may be changed so that the distance ha becomes larger than the given lower limit. Accordingly, the interference between the hand 120 and the substrate 1 can be prevented beforehand.

At STEP 2 in this operating method, the substrate detector 160A is provided at the tip-end part of the hand 120, and detectable of the distance ha before the hand 120 is entirely inserted into the container 112. Therefore, the interference between the hand 120 and the substrate 1 may be reduced. In this respect, the substrate detector 160A is preferably provided at the tip-end part of the hand 120. The term "tip-end part" as used herein indicates the foremost range part of the body part 121 of the hand 120, when a range of the body part 121 from its front end to its rear end is equally divided into three in the front-and-rear direction.

At STEP 2 in this operating method, the substrate detector 160A preferably determines whether the capacitance detected by the substrate detector 160A falls within the given range set in advance. Accordingly, a charging abnormality of the substrate 1 can be detected. The substrate transferring device 201 can reduce a false detection by the substrate detector 160A due to the charging abnormality of the substrate 1.

As illustrated in FIGS. 15(A) to 15(C), the substrate transferring device 201 measures the distance ha in the front-and-rear direction. Therefore, the inclination of the principal surface 1A of the substrate 1 in the front-and-rear direction can be measured. In terms of measuring this inclination, the substrate detector 160A measures the distance ha preferably at two or more positions, and further preferably at three or more positions, in the front-and-rear direction. Particularly, the substrate detector 160A measures the distance ha preferably at positions linearly continuing in the front-and-rear direction.

At STEP 2 in this method of operating the substrate transferring device 201, the inclination of the principal surface 1A in the front-and-rear direction may be determined whether to fall within a given range. Accordingly, a postural abnormality of the substrate 1 can be detected.

As illustrated in FIGS. 16(A) to 16(C), the substrate transferring device 201 measures the distance ha in the front-and-rear direction. Therefore, the warp of the substrate 1 in the front-and-rear direction can be measured. In terms of measuring the warp, the substrate detector 160A measures the distance ha preferably at three or more positions, and further preferably at four or more positions in the front-and-rear direction. Particularly, the substrate detector 160A measures the distance ha preferably at positions linearly continuing in the front-and-rear direction.

At STEP 2 in this method of operating the substrate transferring device 201, the warp of the principal surface 1A in the front-and-rear direction may be determined to fall within a given range. Accordingly, abnormalities in the posture and shape of the substrate 1 can be detected.

At STEP 2 in this operating method, by the inclination and warp of the substrate 1 being measured, the interference between the substrate 1 and the hand 120 may be reduced, and the substrate 1 may be held in a stable posture by the hand 120. In these respects, at STEP 2 in this operating method, the controlling device 70 preferably determines the inclination and warp of the substrate 1.

This substrate detector 160A is not limited to the capacitive sensor, as long as it can detect the change in the distance ha. The substrate detector 160A may be provided to the hand 120 so as to detect the substrate 1 downwardly. The substrate detector 160A may detect a distance to a principal surface 1B of the substrate 1 facing upwardly, instead of to the principal surface 1A. This substrate detector 160A may be used to detect the existence of the substrate 1. Moreover, the substrate detector 160A may detect the distance ha to the principal surface 1A of the substrate 1 held by the hand 120. This can contribute to the improvement in the stability of transferring the substrate 1.

By the substrate transferring device 201 being provided with the substrate detector 160A, it can more accurately detect the abnormality in the posture and shape of the substrate 1 before the hand 120 holds the substrate 1, compared to the conventional one. By the substrate transferring device 201 being provided with the substrate detector 160A, it can prevent the interference between the substrate 1 and the hand 120 moving toward the substrate 1, beforehand. Accordingly, the substrate transferring device 201 can omit the mapping operation of the substrate 1, or can be simplified.

Although the substrate detector 160A is provided to the body part 121, all or a part of the body part 121 may constitute the substrate detector 160. For example, a part or all of the body part 121 made of aluminum alloy may be the substrate detector 160.

Figure 17:
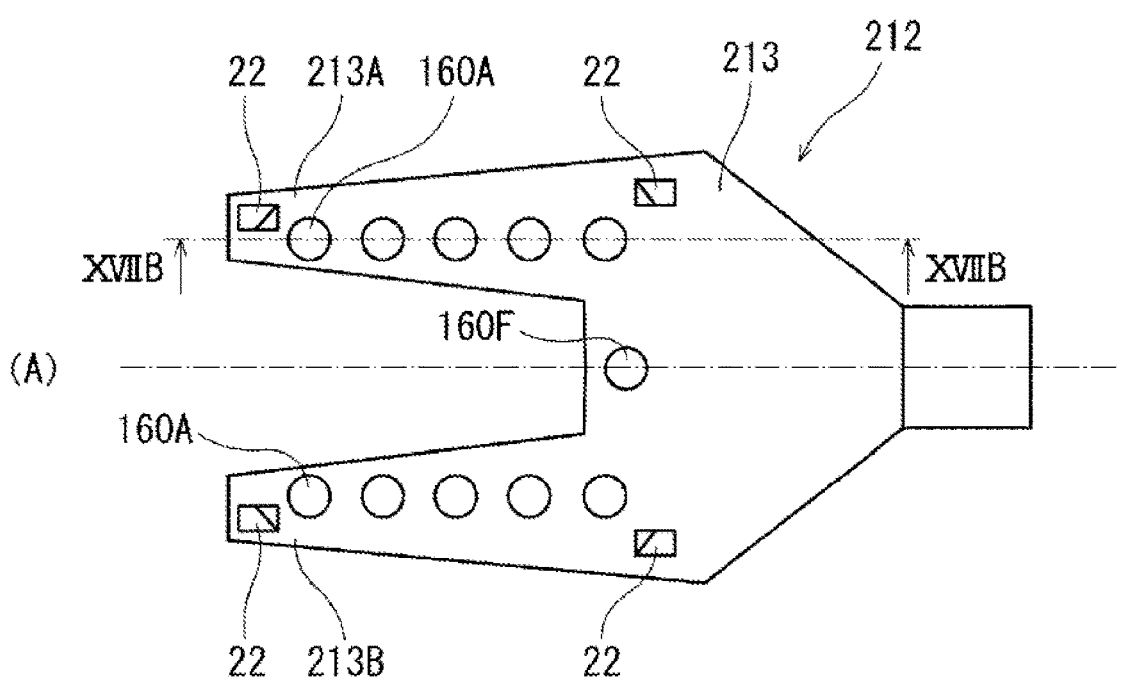
FIG. 17(A) is a top view of a hand of a substrate transferring device of another embodiment according to the present disclosure.
FIG. 17(B) is a cross-sectional view taken along a line XVIIB-XVIIB in FIG. 17(A).
Figure 17:
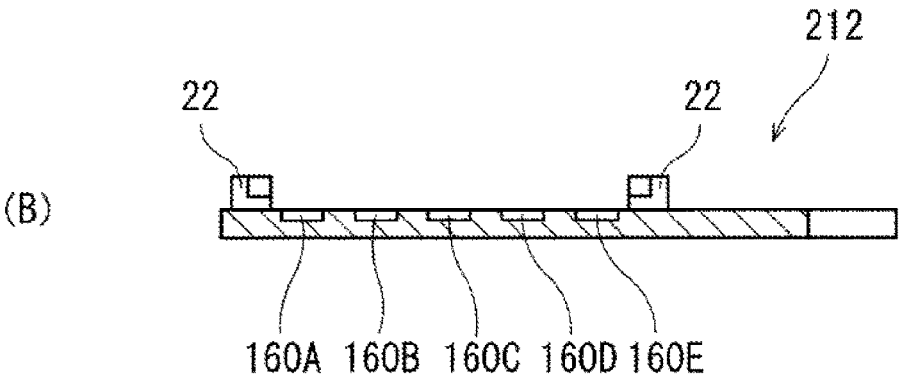

FIGS. 17(A) and 17(B) illustrate a hand 212 of another substrate transferring device 211 according to the present disclosure. This substrate transferring device 211 has a configuration similar to that of the substrate transferring device 201, except for that the hand 212 is provided instead of the hand 120. Here, the configuration different from the substrate transferring device 201 is mainly described, and the similar configuration is omitted to be described. Moreover, the same reference characters are given to the configuration similar to that of the substrate transferring device 201 for description.

The hand 212 has a body part 213 and the plurality of claw parts 22. As illustrated in FIGS. 17(A) and 17(B), the body part 213 is formed in a substantially Y-shape when seen from above, and has a pair of finger parts 213A and 213B. The body part 213 is provided, at its tip-end parts (at tip-end parts of the finger parts 213A and 213B) and base-end part, with the claw parts 22, respectively.

The substrate transferring device 211 is provided with a substrate detector 160F as a second substrate detector, in addition to the substrate detectors 160A. The substrate transferring device 211 is further provided with a plurality of substrate detectors 160B to 160E. The plurality of substrate detectors 160A to 160F are provided to the body part 213 so as to be located at different positions in the front-and-rear direction. The substrate detectors 160A to 160E are aligned in the front-and-rear direction on each of the finger parts 213A and 213B. The substrate detectors 160A to 160E provided to the finger part 213A are located at the same positions as those provided to the finger part 213B, in the front-and-rear direction. Moreover, the substrate detector 160F is provided between the pair of substrate detectors 160A in the left-and-right direction. Although here the substrate detector 160F is the second substrate detector, any of the substrate detectors 160B to 160E may be the second substrate detector instead of the substrate detector 160F.

The substrate transferring device 211 can simultaneously detect the distance ha using the substrate detectors 160A to 160F. Therefore, the shape of the principal surface 1A of the substrate 1 can be grasped more accurately, and the substrate transferring device 211 can easily grasp the inclination and the warp of the surface. In this respect, the substrate detectors 160 preferably perform the detection at three or more positions. The substrate detectors 160 are preferably located at two or more different positions in the front-and-rear direction. Similarly, the substrate detectors 160 are preferably located at three or more different positions in the left-and-right direction.

Embodiment 4

Figure 18:
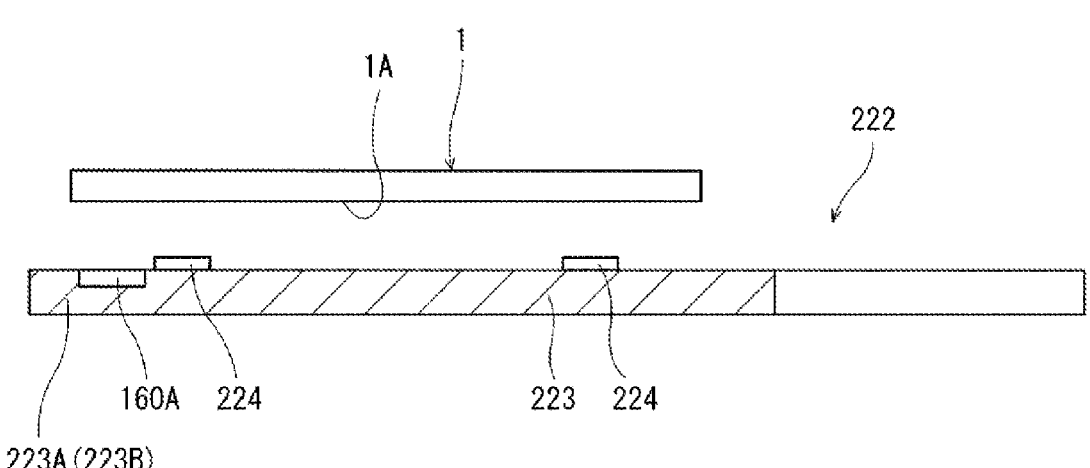
FIG. 18 is an explanatory view illustrating a hand of a substrate transferring device according to Embodiment 4, and a substrate.

FIG. 18 illustrates a hand 222 of still another substrate transferring device 221 according to the present disclosure. This substrate transferring device 221 has a configuration similar to that of the substrate transferring device 201, except for that it is provided with the hand 222 instead of the hand 120. Here, the configuration different from the substrate transferring device 201 is mainly described, and the similar configuration is omitted to be described. Moreover, the same reference characters are given to the configuration similar to that of the substrate transferring device 201 for description.

The hand 222 has a body part 223 and suction pads 224, and is a type of a suction hand. Although not being illustrated, similar to the body part 121, the body part 223 is formed in a substantially Y-shape when seen from above, and has a pair of finger parts 223A and 223B. This hand 222 is provided with four suction pads 224 corresponding to the claw parts 22 of the hand 120. As the suction pad 224, a vacuum suction pad and a Bernoulli suction pad may be illustrated.

This suction pad 224 can demonstrate a larger suction force when a distance between the entire area of a sucking surface of the suction pad 224 and the principal surface 1A of the substrate 1 is unified. The larger suction force contributes to the improvement in the positioning accuracy and the transferring stability of the substrate 1.

In this substrate transferring device 221, the substrate detector 160A detects the distance ha to the principal surface 1A of the substrate 1. By the distance ha being detected at a plurality of locations, the inclination and warp of the principal surface 1A can be obtained. Based on the inclination and warp, the hand 222 can be located at a position where the suction pads 224 can demonstrate the larger sucking force, and thus, the suction pads 224 can suck the substrate 1. Moreover, by the distance ha to the principal surface 1A of the substrate 1 being detected while the suction pads 224 suck the substrate 1, it can be confirmed that the substrate 1 is sucked at and in the given position and posture. Accordingly, the substrate 1 can be stably transferred.

Also in the substrate transferring device 211, the inclination and warp of the principal surface 1A can be more accurately grasped by the plurality of substrate detectors 160 detecting the substrate 1. Moreover, the position of the substrate 1 held by the hand 222 can be grasped accurately. In these respects, the hand 222 is preferably provided with the plurality of substrate detectors 160, similarly to the hand 212.

It is apparent for a person skilled in the art from the above description that many improvements and other embodiments of the present disclosure are possible. Therefore, the above description is to be interpreted only as illustration, and it is provided in order to teach a person skilled in the art the best mode for implementing the present disclosure. The details of the structures and/or the functions may be substantially changed, without departing from the spirit of the present disclosure. Moreover, various inventions can be made by suitably combining the plurality of components disclosed in the above embodiments.

INDUSTRIAL APPLICABILITY

The substrate transferring device and the method of operating the same according to the present disclosure are useful since they can detect the positional deviation of the substrate more accurately than the conventional substrate processing device.

DESCRIPTION OF REFERENCE CHARACTERS

1 . . . Substrate
1a . . . Principal Surface
20, 120, 212, 222 . . . Hand
21 . . . Body Part
21A . . . Finger Part
21B . . . Finger Part
22 . . . Claw Part
30 . . . Manipulator
31 . . . First Connecting Part
32 . . . First Arm
33 . . . Second Connecting Part
34 . . . Second Arm
35 . . . Third Connecting Part
40 . . . Ascendable Member
41 . . . Linear-motion Actuator
50 . . . Casing
60, 160 (160A to 160F) . . . Substrate Detector
61 . . . First Light-emitting Part
62 . . . First Light-receiving Part
70 . . . Controlling Device
80 . . . Mapping Device
81 . . . Second Light-emitting Part
82 . . . Second Light-receiving Part
100, 200 . . . Robot System
101, 201, 211, 221 . . . Substrate Transferring Device
102, 112 . . . Container

What is claimed is:

1. A method for operating a substrate transferring device, the substrate transferring device comprising:

a substrate container configured to hold at least two substrates stacked vertically;

a hand configured to hold one of the at least two substrates, the hand having two fingers;

a manipulator to which the hand is attached;

a controller configured to operate the manipulator in order to move the hand;

a substrate detector provided on at least one finger of the hand and comprising a light-emitter configured to continuously emit a light to a principal surface of the substrate and a light-receiver configured to receive the light reflected by the principal surface of the substrate, the substrate detector configured to determine a distance from the substrate detector to the principal surface;

a mapping device configured on at least one finger of the hand and comprising a light-emitter configured to emit light horizontally, and a light-sensor configured to receive the light from the light emitter, the mapping device configured to output positional information to the controller to indicate a vertical position of a substrate located in the substrate container;

the method being performed in a state in which a higher substrate is positioned above a lower substrate in the substrate container, the method comprising using the controller to:

(i) first, control the manipulator to move the hand to a predetermined distance h1 below a vertical position of the higher substrate detected by the mapping device in order to carry the higher substrate, (ii) second, control the manipulator to move the hand forward to a position to pick up the higher substrate, and (iii) third, while the manipulator is moving the hand forward, the substrate detector measures the distance from the hand to the principal surface of the higher substrate at positions linearly continuing in a front-and-rear direction to take at least three consecutive and linearly aligned measurements: ha5, ha6, ha7;

(iv) fourth, determine that the principal surface of the higher substrate is warped if ha5>ha6 and ha6<ha7; wherein if the controller determines that the principal surface of the higher substrate is warped, the controller predicts based on the subsequent measurements from the substrate detector whether the hand may collide with the higher substrate, and the controller controls the manipulator to withdraw the hand as a result of the controller predicting that collision is possible because the principal surface of the higher substrate is warped.

2. The method for operating the substrate transferring device according to the claim 1, wherein the substrate transferring device further comprising a light-emitter emitting upwardly the light and the light-receiver receiving downwardly.

3. The method for operating the substrate transferring device according to the claim 1, wherein if the controller determines that the distance to the principal surface is less than a predetermined limit, the hand is moved away from the principal surface so that the distance to the principal surface is at least the predetermined limit.

4. A method for operating a substrate transferring device, the substrate transferring device comprising:

a substrate container configured to hold at least two substrates stacked vertically;

a hand configured to hold one of the at least two substrates, the hand having two fingers;

a manipulator to which the hand is attached;

a controller configured to operate the manipulator in order to move the hand;

a substrate detector provided on at least one finger of the hand and configured to detect whether a principal surface of the substrate is warped by taking measurements of a distance from the substrate detector to the principal surface;

a mapping device configured on at least one finger of the hand and comprising a light-emitter configured to emit light horizontally, and a light-sensor configured to receive the light from the light emitter, the mapping device configured to output positional information to the controller to indicate a vertical position of a substrate located in the substrate container; and the method being performed in a state in which a higher substrate is positioned above a lower substrate in the substrate container, the method comprising using the controller to:

(i) first control the manipulator to move the hand to a predetermined distance h1 below a vertical position of the higher substrate detected by the mapping device in order to carry the higher substrate, (ii) second, control the manipulator to move the hand forward to a position to pick up the higher substrate, and (iii) third, while the manipulator is moving the hand forward, the substrate detector is configured to measure the distance from the hand to the principal surface of the higher substrate at positions linearly continuing in a front-and-rear direction to take at least three consecutive and linearly aligned measurements: ha5, ha6, ha7;

(iv) fourth, determine that the principal surface of the higher substrate is warped if ha5>ha6 and ha6<ha7; wherein if the controller determines that the distance to the principal surface of the higher substrate is warped, the controller predicts based on the subsequent measurements from the substrate detector whether the hand may collide with the higher substrate, and the manipulator is configured to withdraw the hand as a result of predicting that collision is possible because the principal surface of the higher substrate is warped.

5. The method for operating the substrate transferring device according to claim 4, wherein the substrate detector comprising a light-emitter to emit a light to the principal surface of the substrate and a light-receiver to receive the light reflected by the principal surface of the substrate.

6. The method for operating the substrate transferring device according to the claim 4, wherein the substrate transferring device further comprising a light-emitter emitting upwardly the light and the light-receiver receiving downwardly.

7. The method for operating the substrate transferring device according to the claim 4, wherein if the controller determines that the distance to the principal surface is less than a predetermined limit, the hand is moved away from the principal surface so that the distance to the principal surface is at least the predetermined limit.

* * * * *